(12) United States Patent
Gulani et al.

(10) Patent No.: US 10,761,171 B2
(45) Date of Patent: Sep. 1, 2020

(54) SYSTEMS AND METHODS FOR FREE-BREATHING THREE-DIMENSIONAL MAGNETIC RESONANCE FINGERPRINTING

(71) Applicant: Case Western Reserve University, Cleveland, OH (US)

(72) Inventors: Vikas Gulani, Shaker Heights, OH (US); Nicole Seiberlich, Shaker Heights, OH (US); Mark A. Griswold, Shaker Heights, OH (US); Yong Chen, Beachwood, OH (US); Bhairav B. Mehta, Cleveland, OH (US); Simone Coppo, Cleveland, OH (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 244 days.

(21) Appl. No.: 15/928,647

(22) Filed: Mar. 22, 2018

(65) Prior Publication Data
US 2018/0217220 A1  Aug. 2, 2018

Related U.S. Application Data

(63) Continuation-in-part of application No. 14/746,575, filed on Jun. 22, 2015, now Pat. No. 10,345,414.
(Continued)

(51) Int. Cl.
*G01R 33/565* (2006.01)
*G01R 33/561* (2006.01)
(Continued)

(52) U.S. Cl.
CPC ....... *G01R 33/56509* (2013.01); *G01R 33/50* (2013.01); *G01R 33/5602* (2013.01);
(Continued)

(58) Field of Classification Search
CPC .............. G01R 33/56509; G01R 33/50; G01R 33/5602; G01R 33/5613; G01R 33/5659;
(Continued)

(56) References Cited

U.S. PATENT DOCUMENTS

| 4,833,434 A | 5/1989 | Takechi |
|---|---|---|
| 7,034,528 B2 | 4/2006 | Minh |

(Continued)

OTHER PUBLICATIONS

B.A. Garner, Modern Legal Usage, A Dictionary of Modern Legal Usage, 1995, 624, 2, Oxford University Press, Oxford.
(Continued)

*Primary Examiner* — Patrick Assouad
*Assistant Examiner* — Sean Curtis
(74) *Attorney, Agent, or Firm* — Quarles & Brady LLP

(57) ABSTRACT

A system and method for generating quantitative images of a subject using a nuclear magnetic resonance system. The method includes performing a navigator module to acquire navigator data, and performing an acquisition module during free breathing of the subject to acquire NMR data from the subject that contains one or more resonant species that simultaneously produce individual NMR signals in response to the acquisition module. The above steps are repeated to acquire data from a plurality of partitions across the volume. The navigator data is analyzed to determine if the NMR data meets a predetermined condition and if not, the above steps are repeated for at least an affected partition corresponding to NMR data that did not meet the predetermined condition. The NMR data is compared to a dictionary of signal evolutions to determine quantitative values for two or more parameters of the resonant species in the volume.

20 Claims, 27 Drawing Sheets

Related U.S. Application Data

(60) Provisional application No. 62/475,067, filed on Mar. 22, 2017.

(51) Int. Cl.
| | | |
|---|---|---|
| *G01R 33/56* | (2006.01) | |
| *G01R 33/50* | (2006.01) | |
| *G01R 33/567* | (2006.01) | |
| *G01R 33/48* | (2006.01) | |

(52) U.S. Cl.
CPC ..... *G01R 33/5613* (2013.01); *G01R 33/5659* (2013.01); *G01R 33/5676* (2013.01); *G01R 33/4818* (2013.01); *G01R 33/5607* (2013.01)

(58) Field of Classification Search
CPC ............ G01R 33/5676; G01R 33/4818; G01R 33/5607
USPC .................................................. 324/300–322
See application file for complete search history.

(56) References Cited

U.S. PATENT DOCUMENTS

| | | | |
|---|---|---|---|
| 7,239,136 B2* | 7/2007 | Sussman | G01R 33/565 |
| | | | 324/307 |
| 8,427,153 B2* | 4/2013 | Hu | G01R 33/3415 |
| | | | 324/309 |
| 8,723,518 B2 | 5/2014 | Seiberlich | |
| 9,097,781 B2* | 8/2015 | Griswold | G01R 33/5612 |
| 9,568,579 B2 | 2/2017 | Jerecic | |
| 9,625,540 B2 | 4/2017 | Griswold | |
| 9,640,070 B2 | 5/2017 | Griswold | |
| 9,869,739 B2* | 1/2018 | Griswold | G01R 33/561 |
| 9,897,675 B2* | 2/2018 | Setsompop | G01R 33/4828 |
| 9,916,823 B2 | 3/2018 | Griswold | |
| 10,143,389 B2* | 12/2018 | Griswold | G01R 33/56563 |
| 10,145,917 B2* | 12/2018 | Seiberlich | G01R 33/50 |
| 10,281,547 B2* | 5/2019 | Griswold | G01R 33/5608 |
| 10,345,414 B2* | 7/2019 | Gulani | G01R 33/50 |
| 2005/0215882 A1 | 9/2005 | Chenevert | |
| 2006/0244445 A1* | 11/2006 | Sussman | G01R 33/565 |
| | | | 324/307 |
| 2008/0004518 A1* | 1/2008 | Stehning | G01R 33/50 |
| | | | 600/410 |
| 2011/0175609 A1* | 7/2011 | Hu | G01R 33/3415 |
| | | | 324/309 |
| 2015/0130460 A1 | 5/2015 | Valori | |
| 2015/0301138 A1* | 10/2015 | Griswold | G01R 33/4818 |
| | | | 324/309 |
| 2015/0301141 A1* | 10/2015 | Griswold | G01R 33/5608 |
| | | | 382/131 |
| 2015/0301142 A1* | 10/2015 | Griswold | G01R 33/4828 |
| | | | 324/309 |
| 2015/0301144 A1* | 10/2015 | Griswold | A61B 5/4064 |
| | | | 324/309 |
| 2015/0302297 A1 | 10/2015 | Griswold | |
| 2015/0346300 A1* | 12/2015 | Setsompop | G01R 33/4828 |
| | | | 324/309 |
| 2016/0025835 A1* | 1/2016 | Gulani | A61B 5/0035 |
| | | | 600/420 |
| 2016/0278661 A1* | 9/2016 | Griswold | G01R 33/56366 |
| 2016/0282430 A1* | 9/2016 | Gulani | G01R 33/4828 |
| 2016/0282434 A1* | 9/2016 | Seiberlich | G01R 33/50 |
| 2018/0217220 A1* | 8/2018 | Gulani | G01R 33/50 |
| 2019/0046052 A1* | 2/2019 | Griswold | G01R 33/4818 |

OTHER PUBLICATIONS

Brittain, J. H., et al. "Coronary angiography with magnetization-prepared T2 contrast." Magnetic resonance in medicine 33.5 (1995): 689-696.

Stanisz GJ, et al. Magn. Reson. Med. 2005; 54:507-12.

Chen, Y. et al, Magnetic Resonance Fingerprinting (MRF) for rapid quantitative abdominal imaging, Int. Soc. Magn. Reson. Med. 2014;561.

Da Bazelaire CM J et al, MR Imaging Relaxation Time of Abdominal and Pelvic tissues Measured in Vivo at 3.0 T: Preliminary Results, Radiology, Mar. 1, 2004, 652-259, 230-3, Radiology Society of North America, United States and Canada.

Doneva M et al., Compressed sensing reconstruction for magnetic resonance parameter mapping, Magnetic Resonance in Medicine, Jun. 17, 2010, 1114-1120, 64-4, John Wiley & Sons Inc, United States.

Hamilton JI, et al. MR Fingerprinting for Quantification of Myocardial T1, T2, and M0 Int. Soc. Magn. Reson. Med. 2015;26.

Jiang Y, et al. Int. Soc. Magn. Reson. Med. 2015:105.

Ma, D., et al., Magnetic Resonance Fingerprinting, Nature. Mar. 14, 2013; 495(7440): 187-192.

Chen, Y., et al. "Free-breathing liver perfusion imaging using 3D through-time spiral GRAPPA acceleration." Investigative radiology 50.6 (2015): 367.

* cited by examiner

SYSTEMS AND METHODS FOR FREE-BREATHING THREE-DIMENSIONAL MAGNETIC RESONANCE FINGERPRINTING

CROSS-REFERENCE TO RELATED APPLICATIONS

This application is based on, claims the benefit of, and incorporates herein by reference, U.S. Provisional Patent Application 62/475,067, filed Mar. 22, 2017 and a continuation-in-part of co-pending U.S. application Ser. No. 14/746,575, filed Jun. 22, 2015.

STATEMENT REGARDING FEDERALLY SPONSORED RESEARCH

This invention was made with government support under DK098503, EB011527, HL094557 and TR000440 awarded by the National Institutes of Health. The government has certain rights in the invention.

BACKGROUND

As explained in co-pending U.S. patent application Ser. No. 14/746,575, fast quantitative imaging of the abdomen and magnetic resonance imaging (MRI) of the abdomen continue to face several challenges. Quantitative parameter measurement in the abdomen is extremely challenging due, at least in part, to the large organs that are part of the anatomy of the abdomen. Quantitative parameter measurement in the abdomen is also challenged by field inhomogeneities, which may be significant over such a large volume. Quantitative parameter measurement in the abdomen may also be challenged by physiological motion in the volume.

Characterizing tissue species using nuclear magnetic resonance (NMR) can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting (MRF), which is described in Magnetic Resonance Fingerprinting, Ma D et al., Nature 2013:495, (7440): 187-192.

Conventional magnetic resonance (MR) pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time (TE) while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When MR images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency (RF) is applied. The term "resonant species", as used herein, refers to an item (e.g., water, fat, tissue, material) that can be made to resonate using NMR. By way of illustration, when RF energy is applied to a volume that has different resonant tissues (e.g., normal liver tissue, cancerous lesion in liver), then both the different resonant species will produce an NMR signal. However the signal from the first resonant tissue will be different from the signal from the second resonant tissue and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

SUMMARY

In accordance with one aspect of the disclosure, a method is provided for generating quantitative images of a subject. The method includes performing a pulse sequence, using a nuclear magnetic resonance (NMR) system. The pulse sequence includes (i) performing a navigator module to acquire navigator data during free breathing of the subject and (ii) performing an acquisition module during the free breathing of the subject to acquire NMR data from a volume in the subject that contains one or more resonant species that simultaneously produced individual NMR signals in response to the acquisition module. The pulse sequence also includes (iii) repeating steps (i) and (ii) to acquire data from a plurality of partitions across the volume and (iv) analyzing the navigator data to determine that the NMR data meets a predetermined condition and repeating steps (i) and (ii) for at least an affected partition corresponding to NMR data that did not meet the predetermined condition. The method also includes comparing the NMR data to a dictionary of signal evolutions to determine quantitative values for two or more parameters of the resonant species in the volume based, at least in part, on matching the acquired NMR data to a set of known MRF signal evolutions stored in the dictionary, wherein the two or more parameters include T1, T2, and proton density, T1 being spin-lattice relaxation, T2 being spin-spin relaxation. The method also includes producing an image of at least the volume of the subject based, at least in part, on the quantitative values In accordance with another aspect of the disclosure, a method is provided for generating three-dimensional imaging data from an abdomen of a subject. The method includes acquiring, using a nuclear magnetic resonance (NMR) system, NMR data from a volume in an abdomen of a subject using a series of partitions, where each partition includes one or more segments. Each of the partitions includes (i) a navigator module configured to acquire navigator data during a free breathing period of the subject; and (ii) an acquisition module configured to acquire NMR data from the abdomen during the free breathing period, where the acquisition module is configured to elicit one or more resonant species within the abdomen to simultaneously produce a signal evolution. The NMR system is configured to repeat steps (i) and (ii) to acquire data from a plurality of partitions across the volume in the abdomen of the subject, and to analyze the navigator data to determine that the NMR data meets a predetermined condition. The NMR system is further configured to repeat steps (i) and (ii) for at least an affected partition corresponding to NMR data that did not meet the predetermined condition, and to compare the NMR data to a dictionary of signal evolutions to determine quantitative values for two or more parameters of the resonant species in the volume based, at least in part, on matching the acquired NMR data to a set of known MRF signal evolutions stored in the dictionary. The NMR system may be further configured to produce a three-dimensional image of the volume in the abdomen based, at least in part, on the quantitative values.

In accordance with one aspect of the disclosure, a magnetic resonance imaging (MRI) system is provided that includes a magnet system configured to generate a polarizing magnetic field about at least a portion of a subject arranged in the MRI system and a plurality of gradient coils configured to apply a gradient field to the polarizing magnetic field. The MRI system also includes a radio frequency (RF) system configured to apply an excitation field to the subject and acquire MR image data from a ROI and a computer system. The computer system is programmed to control the plurality of gradient coils and the RF system to perform a pulse sequence by (i) performing a navigator module to acquire navigator data during free breathing of the subject and (ii) performing an acquisition module during the free breathing of the subject to acquire NMR data from a volume in the subject that contains one or more resonant species that simultaneously produced individual NMR signals in response to the acquisition module. The computer system is also programmed to perform the pulse sequence by (iii) repeating steps (i) and (ii) to acquire data from a plurality of partitions across the volume and (iv) analyzing the navigator data to determine that the NMR data meets a predetermined condition and repeating steps (i) and (ii) for at least an affected partition corresponding to NMR data that did not meet the predetermined condition. The computer system is also programmed to compare the NMR data to a dictionary of signal evolutions to determine quantitative values for two or more parameters of the resonant species in the volume based, at least in part, on matching the acquired NMR data to a set of known MRF signal evolutions stored in the dictionary, wherein the two or more parameters include T1, T2, and proton density, T1 being spin-lattice relaxation, T2 being spin-spin relaxation. The computer system is further programmed to produce an image of at least the volume of the subject based, at least in part, on the quantitative values. The MRI system also includes a display to display the image of at least the volume of the subject based, at least in part, on the quantitative values.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
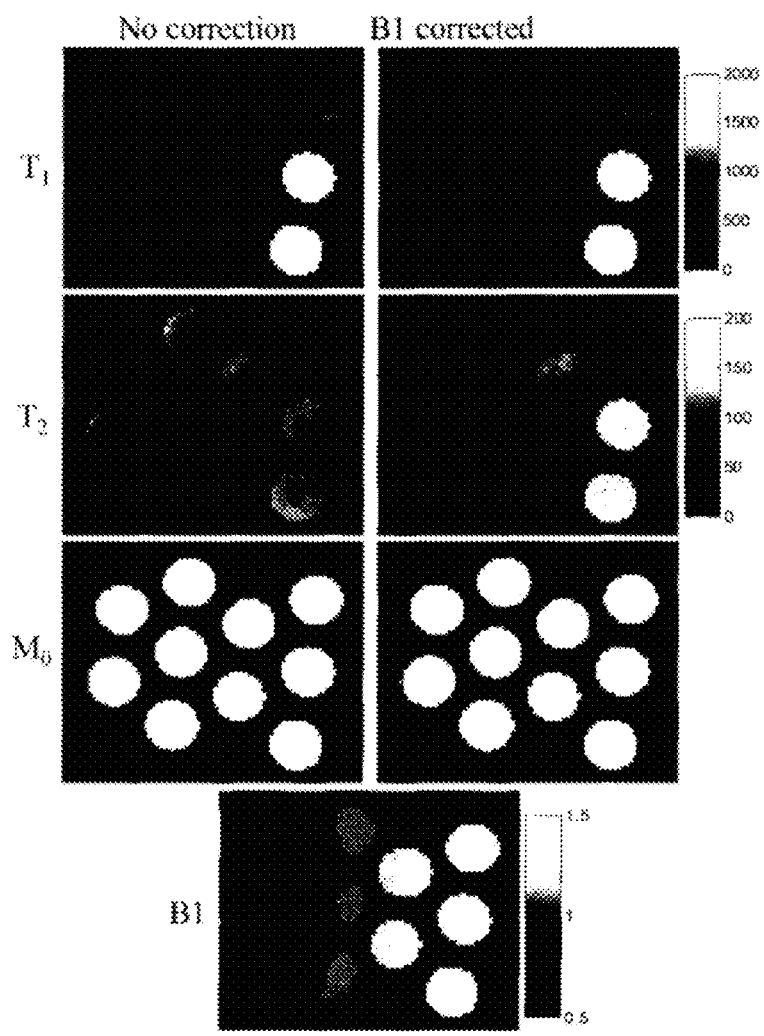
FIG. 1 illustrates T1, T2, and proton density maps acquired using an example FISP-MRF approach before and after B1 correction.

Quantitative T1 and T2 mapping is extremely challenging in the abdomen due to the deleterious effects of respiratory motion. As will be described, an MR fingerprinting (MRF) technique is provided for quantitative abdominal imaging, which can provide simultaneous T1 and T2 quantification in a single breath-hold for 2D imaging and free-breathing for 2D and 3D imaging. This technique allows the use of MRF for a variety of clinical applications, including lesion detection and characterization in abdomen.

Also, another MRF technique is provided that is able to acquire data in a single breath hold. Thus, this second MRF technique can be used for clinical applications that require volumetric coverage with a preference for a completely free-breathing scan. More particularly, a technique is provided for a navigated, free-breathing 3D acquisition with volumetric coverage.

First Technique

Magnetic Resonance Fingerprinting (MRF) provides a new paradigm for magnetic resonance imaging (MRI) acquisition and reconstruction. MRF also provides new opportunities for quantitative analysis of acquired data. MRF facilitates rapid, efficient, and simultaneous quantification of multiple tissue properties. (See, e.g., Magnetic Resonance Fingerprinting, Ma D et al., Nature 2013:495, (7440):187-192). Example apparatus and methods use MRF for accurate and high-resolution quantification of multiple tissue properties in the abdomen. Example apparatus and methods may perform accurate and high-resolution quantification in a single clinically feasible breath-hold (e.g., less than 20 seconds).

Example apparatus and methods perform accurate quantification in the presence of significant B0 and B1 field inhomogeneities. Example apparatus and methods provide a rapid and robust MRF technique in combination with a fast imaging with steady-state free precession (FISP) acquisition and Bloch-Siegert B1 mapping. In one embodiment, quantitative characterization of different types of focal liver lesions may be made. Example apparatus and methods provide spatial resolution (e.g., 1.9 mm in-plane) and FOV (e.g., 44 cm) suitable for quantitative abdominal imaging. Example apparatus and methods also provide quantitative characterization of different types of focal lesions in the abdomen.

Quantitative MR measurement can provide a great deal of information about tissue properties and pathological conditions. In the abdomen, for example, mapping of T1 relaxation time has been used for functional imaging of cirrhotic versus control livers. Mapping of T1 relaxation time has also shown potential to be an imaging marker for declining renal function. Additionally, quantitative T2 mapping has significantly outperformed expert radiologists reading T2-weighted images in sensitivity, specificity, and accuracy when separating benign and malignant liver lesions. Preclinical studies also report that T2 relaxation time is highly predictive of tumor response to therapy, suggesting a potential use for early prediction of treatment effectiveness.

Experiments using example apparatus and methods were performed using MRF data from the abdomens of healthy volunteers. FIG. 1 illustrates T1, T2, and proton density maps acquired using FISP-MRF before and after B1 correction. FIG. 1 presents the T1, T2, and proton density maps acquired from phantom studies using the FISP-MRF method before and after B1 correction. With the additional surface coil, a maximum of 45% change in B1 magnitude was observed, which is in a similar scale as the B1 variation observed in the in-vivo measurements. Unlike conventional methods that typically show a dependence of T1 on the B1, phantom results consistently showed a dependence of T2 on B1. However, after B1 correction, both T1 and T2 values are in good agreement with values acquired using conventional methods.

Figure 2:
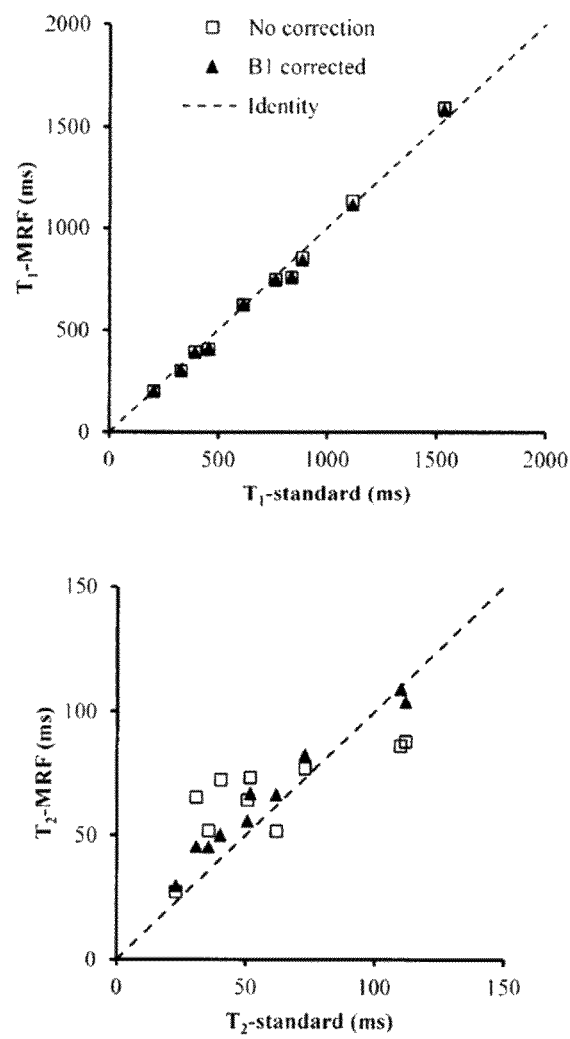
FIG. 2 illustrates T1 and T2 values produced using an example FISP-MRF approach before and after B1 correction.

FIG. 2 illustrates T1 and T2 values produced using FISP-MRF before and after B1 correction. A maximum 50% change in B1 magnitude was observed, which caused substantial changes in the parameters. Unlike conventional methods that typically show a dependence of T1 on B1, example FISP-MRF shows a dependence of T2 on B1. After the B1 correction, both T1 and T2 values produced by example FISP-MRF apparatus and methods agree with values acquired using standard methods.

Figure 3:
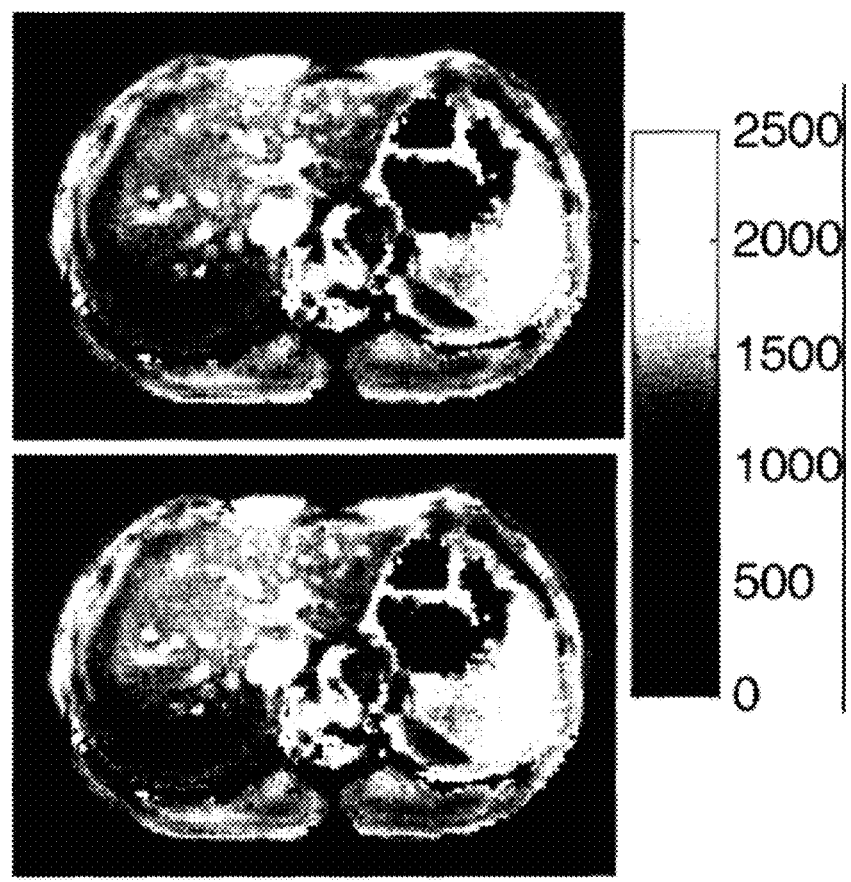
FIG. 3 illustrates parameter maps acquired with FISP-MRF before B1 corrections.
Figure 4:
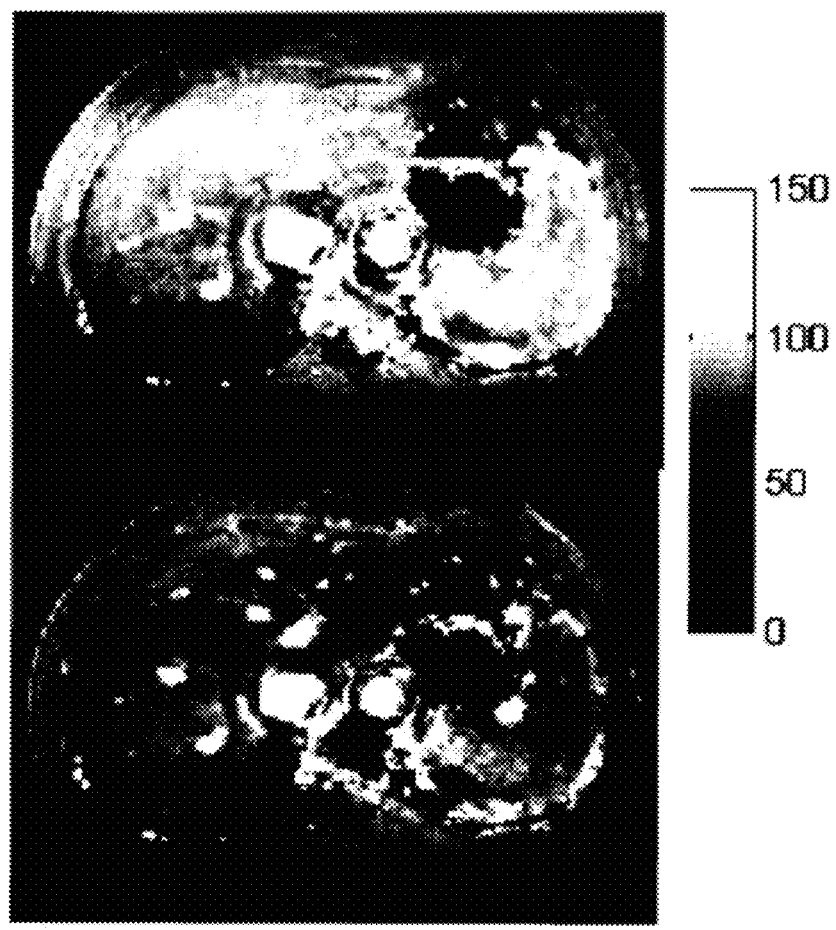
FIG. 4 illustrates parameter maps acquired with FISP-MRF after B1 corrections.
Figure 5:
FIG. 5 illustrates the B1 map associated with FIGS. 3 and 4.

FIG. 3 illustrates T1 maps obtained from an asymptomatic volunteer. FIG. 4 illustrates T2 maps obtained from an asymptomatic volunteer. A significant difference in T2 (e.g., from 70 ms to 35 msec) is observed in the liver both with and without correction. The 35 msec is in better agreement with standard values. (See, e.g., De Bazelaire C M J, et al., Radiol, 2004). Example FISP-MRF provided superior performance over conventional bSSFP-MRF approaches. For example, banding artifacts seen in maps produced using a bSSFP-MRF approach were minimized or even eliminated in the FISP-MRF approach. FIG. 5 illustrates the B1 map associated with the T1 and T2 maps in FIGS. 3 and 4.

In conventional MR imaging, pathological changes often alter one or more tissue properties (e.g. T1, T2, proton density) simultaneously. Accurate and reliable diagnostics thus rely on comparing images with different weightings. An ideal clinical MRI exam would include simultaneous quantitative measurement of multiple tissue properties. Conventionally, quantitative analysis of MR relaxation parameters can be extremely challenging in moving regions like the abdomen. Using conventional approaches, several images must be acquired at different time points along an exponential signal decay or recovery curve to calculate the relevant relaxation parameter at each pixel. Thus, several full images are required to map a single parameter. This is an inherently inefficient process, which causes current clinical standard practices to eschew parameter mapping. Instead, current practices include examining a single image weighted by a parameter.

In one embodiment, to accelerate data sampling, highly under-sampled images were acquired with a uniform density spiral readout. Acceleration factors of 12, 24, and 48 were investigated. In one embodiment, 48 spiral interleaves with zero moment gradient compensation were designed for a 2D image to meet the Nyquist criteria using the minimum-time gradient design. In this embodiment, the maximum gradient amplitude and slew rate were 21 mT/m and 162 mT/m/ms, respectively. Other gradient amplitudes and slew rates may be employed in other embodiments. The readout time per spiral interleaf was 2.9 ms. In one verification of this embodiment, a total of 2500 under-sampled images were acquired in 17 s and the spiral interleafs in the images were rotated 7.5° to provide different spatial encoding. Other imaging parameters in this study were: FOV=44×44 cm; matrix size 224×224 for an effective in-plane resolution of 1.9 mm; TE, 1.3 ms; slice thickness 5 mm; RF pulse: 1-ms sinc pulse (time-bandwidth product: 4). Other imaging parameters may be employed in other embodiments.

Applying FISP-MRF for high-field abdominal imaging includes accounting for transmit field (B1) inhomogeneities encountered over a large FOV like that associated with the abdomen. Thus, a B1 field map may be acquired in a separate scan using the Bloch-Siegert technique. There are a wide variety of B1 mapping techniques available. Unlike conventional double-echo methods that use signal magnitude changes for B1 quantification, the Bloch-Siegert technique uses an off-resonance RF pulse to generate phase differences for B1 encoding. This technique provides an accurate and efficient B1 mapping that is insensitive to either T1 or B0 field inhomogeneity. One limitation of the Bloch-Siegert method is the potential high specific absorption rate (SAR) associated with the long (e.g., 8 ms) off-resonance RF pulses. Therefore, some Bloch-Siegert methods may use long repetition times (TRs), which results in an acquisition time of approximately 25 s per slice with Cartesian encoding. Example apparatus and methods may improve the efficiency of a Bloch-Siegert technique by combining it with a spiral readout. The improved method provides a 12-fold acceleration in scan time while preserving spatial resolution. An example central-out spiral trajectory improves the signal to noise ratio (SNR) of the images upon which phase measurement depends. While the Bloch-Siegert technique is described, different embodiments may acquire B1 field maps in different ways. In one embodiment that reduces the SAR, a gradient-echo based Bloch-Siegert sequence may be implemented with a multi-shot spiral acquisition. One example multi-shot acquisition may include 24 spiral interleaves per image with a readout duration per spiral interleaf of 3.0 ms. An off-resonance 8-ms Fermi pulse may be applied between the excitation pulse and spiral readout to induce a B1-dependent phase shift. In this embodiment, other imaging parameters included: FOV=44×44 cm; matrix size 128×128; slice thickness 5 mm; TR, 30 ms; TE, 1.3 ms. Other imaging parameters may be employed in other embodiments. In one study of this embodiment, two images were acquired with ±4 KHz frequency off-resonance in an interleaved manner and the total acquisition time for a B1 map was 1.8 s.

The spiral data for FISP-MRF and B1 measurements may be reconstructed using a non-uniform Fast Fourier Transform. For both the FISP-MRF and B1 measurements, an adaptive combination method may be used to estimate the coil sensitivity maps to combine images from individual coils. In one embodiment, for B1 quantification, a low-resolution B1 map with a matrix size of 128×128 may first be obtained from the phase difference of the two images acquired with different off-resonances. A median 4×4 filter may then be applied and the de-noised B1 map may then be interpolated to the matrix size 224×224 to match the size of the FISP-MRF measurement for MRF parameter mapping. Different matrix sizes and filter sizes may be employed in different embodiments.

To retrieve tissue properties including, for example, T1, T2 and M0 from the FISP-MRF data, a dictionary including the signal evolutions from possible combinations of parameters for a T1 range of 100 to 3000 ms, T2 range of 5 to 500 ms, and B1 range of 10% to 200% may be calculated using Bloch simulations. Detailed ranges and step sizes used for T1, T2 and B1 in one embodiment that included a total of 82,914 entries are presented in Table 1.

TABLE 1

|  | Range | Step size |
|---|---|---|
| $T_1$ | 100~600 | 100 |
|  | 600~1600 | 20 |
|  | 1700~2200 | 100 |
|  | 2300~3000 | 300 |

TABLE 1-continued

|  | Range | Step size |
|---|---|---|
| $T_2$ | 5~100 | 5 |
|  | 110~200 | 10 |
|  | 300~500 | 100 |
| B1 | 0.1~2 | 0.05 |

Example apparatus and methods were verified using both phantom studies and in vivo studies. In one phantom study, accuracy was validated using an agarose gel phantom that contained ten vials with different concentrations of gadolinium. A passively coupled transmit surface coil was used to generate a highly non-uniform B1 field. T1 and T2 relaxations times obtained from the FISP-MRF measurements with or without the consideration of the induced B1 field were then compared to values obtained using conventional methods. In one validation, reference T1 values were established using an inversion-recovery single-echo spin-echo sequence with a TR of 6 s and seven inversion times from 50 ms to 3800 ms, and reference T2 values were measured using a single-echo spin-echo sequence with a TR of 6 s and eight different echo times from 20 ms to 800 ms.

In one in vivo validation, quantitative measurements using FISP-MRF were performed on six asymptomatic subjects (M:F, 2:4; mean age, 26.8 years) and two patients (males, mean age, 56.5 years), one with metastatic lung adenocarcinoma and the other with hepatocellular carcinoma (HCC) recurrence after radiation therapy. The FISP-MRF and B1 measurements were performed at one to three different slice locations in the axial orientation. For the different slices, a FISP-MRF scan and a B1 scan were acquired consecutively in a single breath-hold of approximately 19 s to ensure the same slice coverage. For the patient scans, the slices were prescribed at the location of liver lesions based on coronal T2-weighted images or patients' previous MR exams. Four quantitative maps, including T1, T2, M0 and B1, were obtained for slices after the image reconstruction and post-processing.

MRF reconstruction was performed on the same in-vivo measurement using subsets of FISP-MRF data from the first 500 images up to 2000 images. Quantitative maps reconstructed from the 2500 images were used as a reference. The results obtained from the subsets were compared to this reference and normalized Root Mean Square Error (NRMSE) was calculated for T1, T2 and M0.

Figure 19:
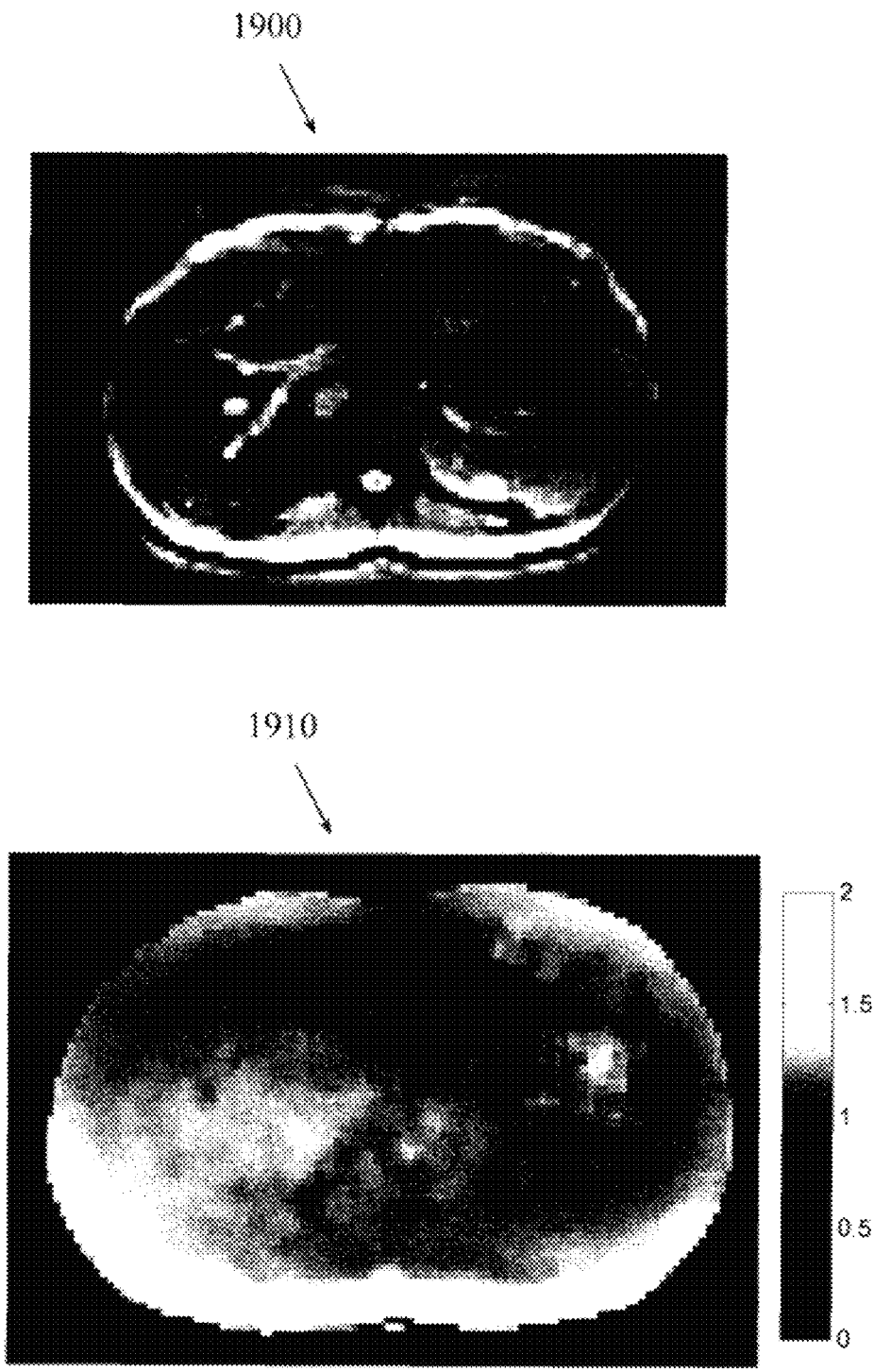
FIG. 19 illustrates an example abdominal image.

FIG. 19 shows one example abdominal image 1900 acquired using the Bloch-Siegert method and its corresponding B1 map 1910. A non-uniform B1 field was observed, particularly in the anterior and posterior areas of the abdomen. The average B1 value was 92.3% across the abdomen, with a minimum B1 of approximately 46.8% encountered at the stomach and a maximum B1 of 140.7% at the posterior. These values represent the percentage of the B1 field anticipated to be created by the MR apparatus.

Figure 20:
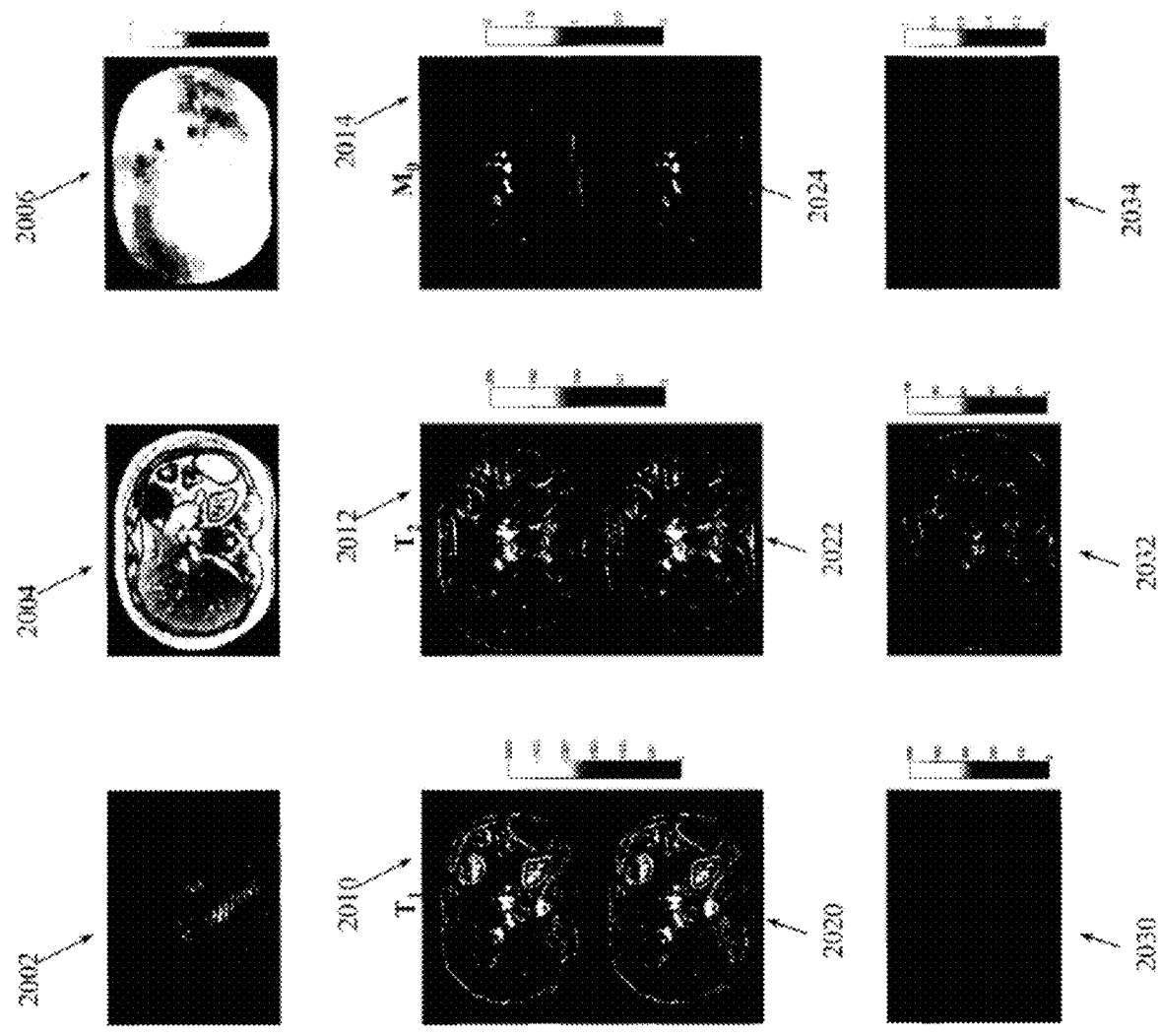
FIG. 20 illustrates quantitative maps obtained from a normal volunteer.

FIG. 20 presents the quantitative maps obtained from a normal volunteer. Image 2002 shows one representative image out of 2500 images. Significant aliasing artifacts were observed due to the high acceleration factor. The anatomy of the acquired slice can be observed from the image summed up from the 2500 aliased images as illustrated in image 2004. The corresponding B1 map for this slice is shown in image 2006. The three quantitative maps (T1, T2 and M0) before and after B1 correction are shown in images 2010-2014 and 2020-2024, respectively. The difference maps between the before and after are shown in images 2030-

2034. Similar to the validation performed using the phantom, a clear difference in the T2 map rather than T1 was observed after the B1 correction and the pattern of T2 difference matches well with that of B1 map 2006 and 2032. For example, towards to the edge of the liver where B1 was 78.4%, a difference of 46.9% in T2 relaxation time was observed. However, the difference for T2 was only 2.2%. Compared to the T2 map without B1 correction 2012, a visually smoother T2 map was observed in the entire liver after the B1 correction 2022. In addition, no banding artifacts were observed in the maps.

Figure 21:
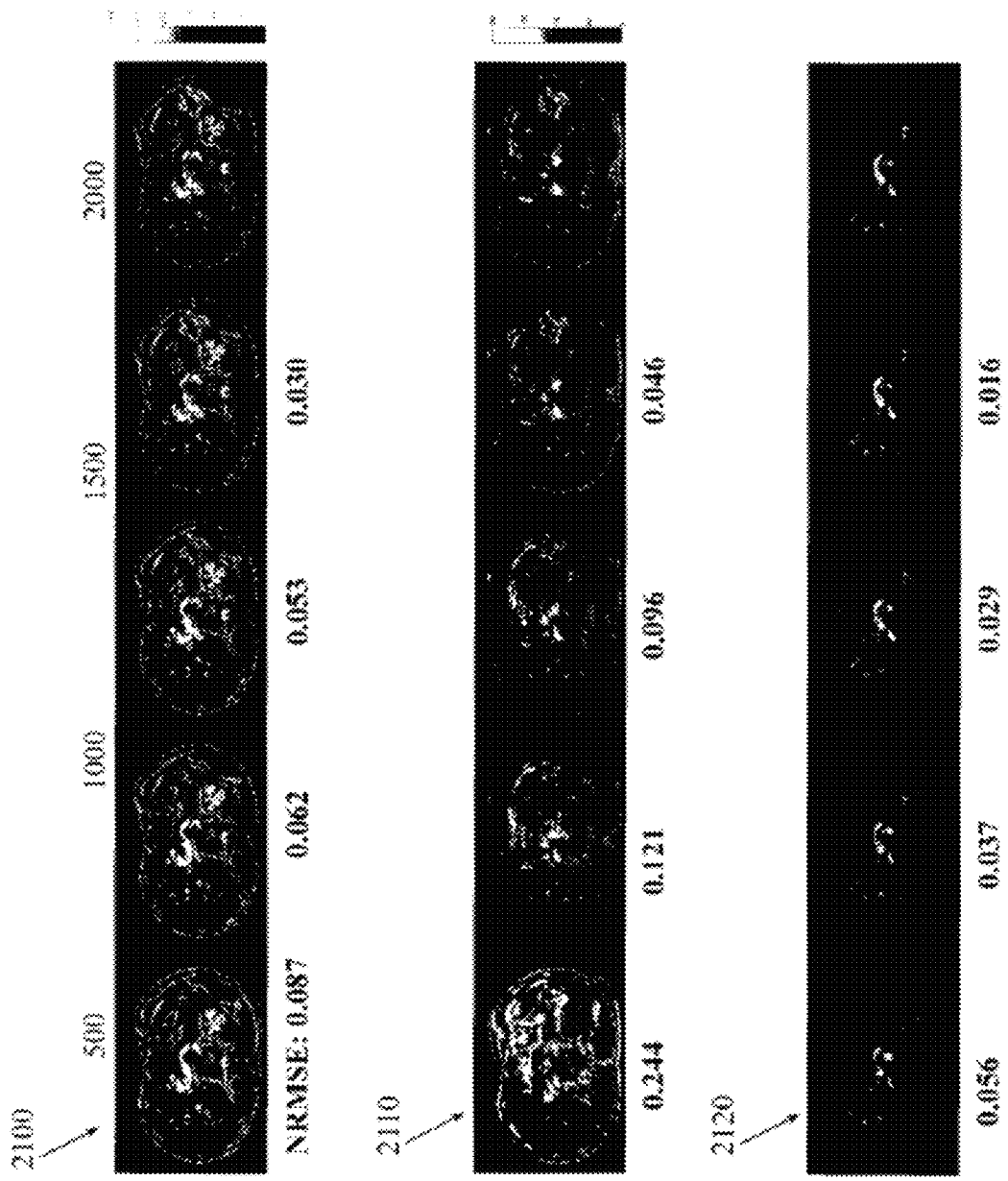
FIG. 21 illustrates T1, T2, and M0 maps associated with the patient of FIG. 20.

The effect of the number of images on the accuracy of multi-parametric quantification was evaluated using an in-vivo dataset acquired from a normal subject. FIG. 21 shows the T1, T2 and M0 maps obtained from the same subject reconstructed using the first 500, 1000, 1500 and 2000 images. The maps obtained using all 2500 images are shown on the right columns of 2100, 2110, and 2120 as a reference. A monotonic decrease in NRMSE was observed in all three quantitative maps with an increasing number of images. For both T1 and M0, MRF quantification using the first 500 images already presents visually smooth maps that are similar to the reference maps (NRMSE=0.087 for T1 and 0.056 for M0). However, for T2 quantification, substantial differences from reference images or values were observed in the maps 2110 computed with 1500 images or less. When 2000 images were employed, a close match with little artifact errors was achieved, which yields a NRMSE of 0.046.

Figure 22:
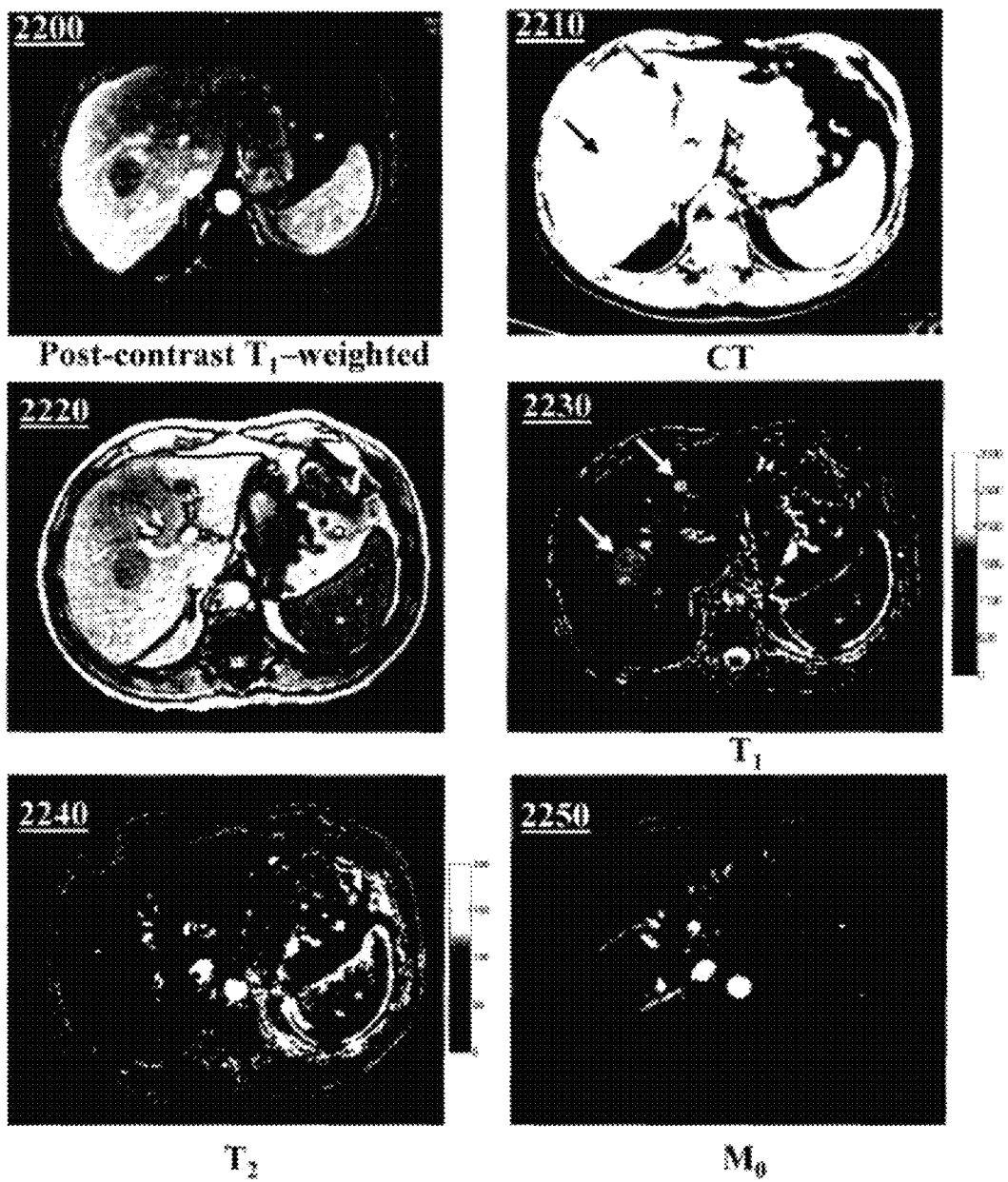
FIG. 22 illustrates results obtained from a patient with metastatic lung adenocarcinoma.

For further validation, two patients with different types of liver lesions were scanned with example FISP-MRF methods and apparatus. FIG. 22 shows the quantitative MRF maps and conventional images acquired from a patient with metastatic lung adenocarcinoma. Excellent image quality and visualization of abnormal tissues were achieved in the quantitative maps obtained using the example FISP-MRF apparatus and methods. Two metastatic lesions (lesion 1, 32.9 mm; lesion 2, 9.8 mm) were observed in the liver from the quantitative MRF results in images 2230 and 2240, which agrees well with the clinical CT and MRI findings illustrated in 2200 and 2210. Compared to the normal surrounding tissue, similar increases in T1 relaxation times were observed for both metastatic lesions (lesion 1, 1462 ms; lesion 2, 1582 ms; surrounding tissue, 686 ms). Apparent T2 increase was only observed in lesion 1 as compared to the surrounding tissue (lesion 1, 57 ms; lesion 2, 19 ms; surrounding tissue, 26 ms), which indicates the heterogeneity between the two lesions.

Figure 23:
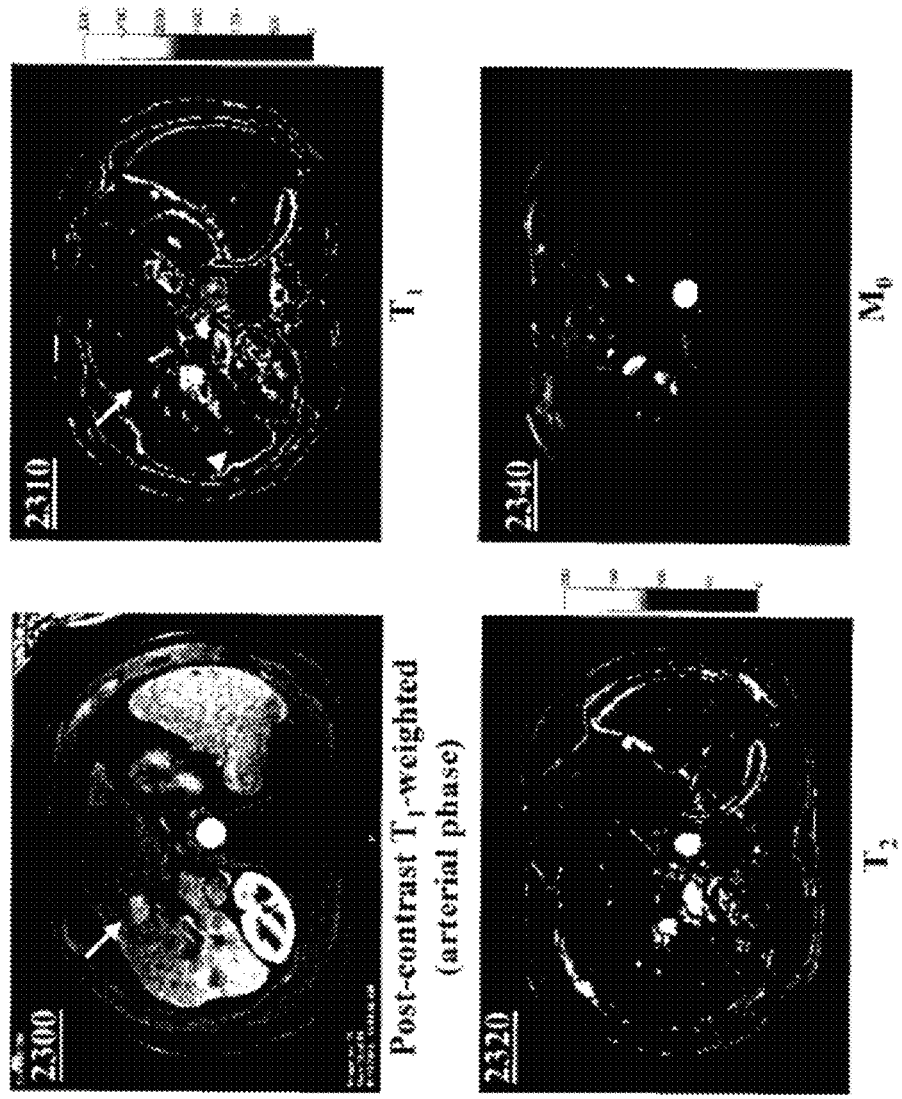
FIG. 23 illustrates results obtained from a patient with hepatocellular carcinoma (HCC).

FIG. 23 shows the results obtained from a patient with HCC. The patient has a new HCC lesion after treatment, which is visible in the post-contrast image 2300 acquired at the arterial phase 20 s after contrast injection. Some heterogeneous tissues in the right hepatic lobe, possibly related to prior radiation therapy, are also visible in image 2300. Compared to the surrounding tissue, this new HCC lesion had a slightly lower T1 value of 789 ms versus 871 ms as illustrated in image 2310. T1 for the post-treatment area was substantially increased to 1038 ms. The T2 value for this post-treatment area also increased slightly from 40 ms to 26 ms as shown in image 2320. No apparent difference was observed in the M0 map for the lesions as illustrated in image 2330.

Example apparatus and methods use MRF to cause resonant species (e.g., resonant tissues) in an object to produce pseudorandom MR signal evolutions. The pseudorandom signal evolutions may be compared to a dictionary of stored signal evolutions. The comparison may be performed using, for example, an orthogonal matching pursuit (OMP) technique. (See, e.g., Doneva M, et al. MRM, 2010) The stored signal evolutions may be from previous acquisitions or may even be from theoretical models. For example, the stored signal evolutions can be from a set described by:

$$SE = \sum_{i=1}^{N_S} \sum_{i=1}^{N_A} \sum_{j=1}^{N_{RF}} R_{i(\alpha)} R_{RF_{ij}(\alpha,\phi)} R(G) E_i(T1, T2, K) DPdM_0 \quad (1)$$

or $$SE = \sum_{i=1}^{N_S} \sum_{i=1}^{N_A} \sum_{j=1}^{N_{RF}} R_{i(\alpha)} R_{RF_{ij}(\alpha,\phi)} R(G) E_i(T1, T2, K) DPdM_0 \quad (2)$$

where:

SE is a signal evolution, Ns is a number of spins, $N_A$ is a number of sequence blocks, $N_{RF}$ is a number of RF pulses in a sequence block, a is a flip angle, $\phi$ is a phase angle, $R_{i(\alpha)}$ is a rotation due to off resonance, $R_{RF_{ij}(\alpha, \phi)}$ is a rotation due to RF differences, R(G) is a rotation due to a gradient, T1 is spin-lattice relaxation, T2 is spin-spin relaxation, D is diffusion relaxation, Pd is proton density, Ei(T1, T2, . . . ) is decay due to relaxation differences, and $M_0$ is the default or equilibrium magnetization.

Some MRF investigations may involve a sample for which there is a priori knowledge about the resonant species that are likely to be encountered. The a priori knowledge may even include information concerning possible or expected ratios of the amounts of the resonant species to be encountered in the sample or about the properties of the resonant species. When the sample has some properties (e.g., T1 relaxation time, T2 relaxation time) or combinations of properties that are likely to fall in a certain range, then it may be possible to simplify or even focus the pattern matching portion of MRF. Therefore, example apparatus and methods may use a dictionary having signal evolutions that cover combinations of T1 values in a range of 10-3000 ms and T2 values in the range of 5-500 ms. The signal evolutions may be modified to account for B1 variations from 10% to 200% of an intended B1 field.

MRF involves measuring pseudorandom MR signal evolutions produced in response to MRF pulse sequences. MRF also includes generating modeled signal evolutions that may be stored in a dictionary. The dictionary entries may be a function of several parameters. If the composition of the sample to be interrogated is known ahead of time, then a mathematical operation (e.g., weighted sum) of dictionary entries corresponding to the known components may be used to model signal evolutions and an inverse mathematical operation (e.g., matrix pseudo-inverse) may be used to compute the relative fraction of components assumed to be present based on a received signal evolution.

Figure 18:
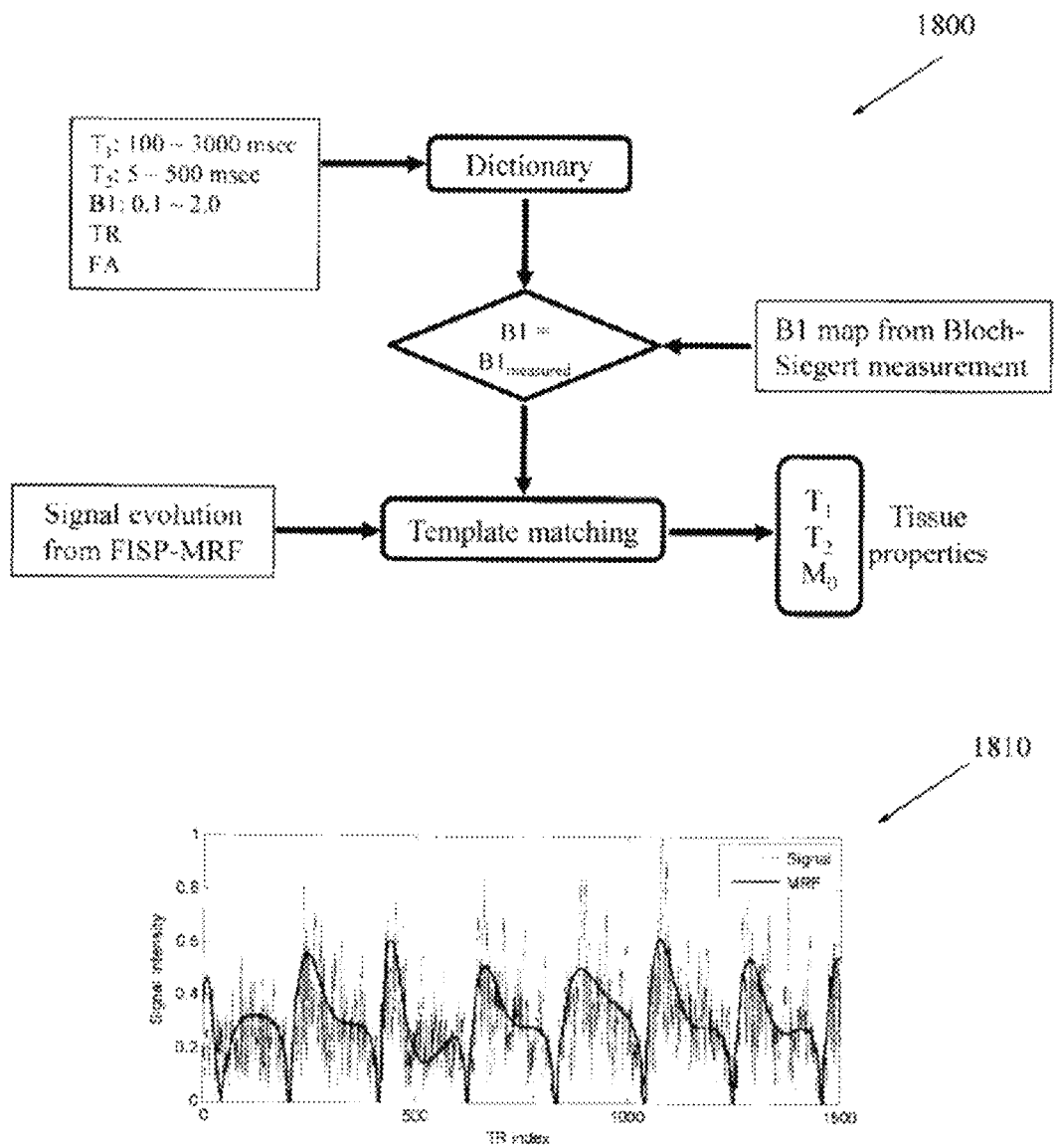
FIG. 18 illustrates an example FISP-MRF process that includes B1 correction, a representative signal evolution curve, and a matching dictionary entry.

The acquired signals in the pixels of the highly accelerated images may then be matched to entries in the dictionary that have the same B1 values as measured. A "best" or "matching" entry may be identified using MRF. The best or matching entry yields the underlying parameters that were used to form the dictionary entry. FIG. 18 illustrates an example FISP-MRF process 1800 that includes B1 correction. FIG. 18 also illustrates an example representative signal evolution curve and a matched dictionary entry 1810.

MRF simultaneously provides quantitative data concerning multiple MR parameters. Observed signal evolutions are matched to dictionary entries using, for example, template matching or other matching or comparing processes. In one example matching process, the inner product is computed between a noisy acquired signal and entries in a dictionary to find the stored signal evolution to which an acquired signal evolution most closely matches. In other examples, other pattern matching or similarity finding approaches are performed. Values related to the dictionary entry that matched the acquired noisy signal may then be retrieved. In one example, the values may be stored in the dictionary, while in another example MR parameters may be stored in a data store separate from the dictionary. In one embodiment, the values may be retrieved by performing a mathematical operation on a signal evolution.

Figure 6:
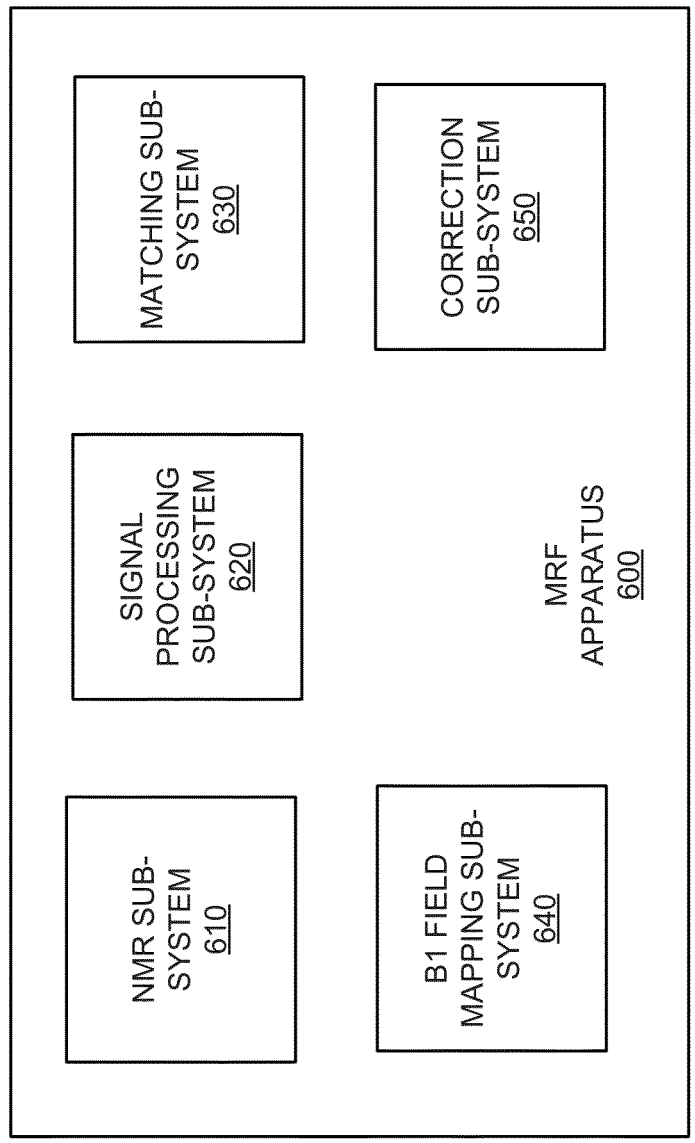
FIG. 6 illustrates an example MR apparatus associated with rapid quantitative abdominal imaging using FISP-MRF.

FIG. 6 illustrates an MRF apparatus 600. MRF apparatus 600 may, for example, be part of a Siemens 3T Skyra scanner having 32 receive channels. MRF apparatus 600 may simultaneously quantify MR parameters including T1, T2, M0, or proton density for an object to which a FISP-MRF pulse sequence is applied.

MRF apparatus 600 includes an NMR logic 610. In one embodiment, the NMR logic 610 applies RF energy to the object according to a FISP-MRF pulse sequence. Original MRF approaches for the brain may have employed an inversion-recovery balanced steady state fee-precession (IR-bSSFP). However, the IR-bSSFP may be sensitive to magnetic field inhomogeneities which may in turn make it poorly suited for high-field abdominal imaging. Thus, example apparatus and methods may employ a FISP-MRF technique.

NMR logic 610 repetitively and variably samples an object in a (k, t, E) space to acquire a first set of data. The first set of data may be a set of NMR signals that may have non-constant amplitude and/or phase. Members of the set of NMR signals are associated with different points in the (k, t, E) space. In different embodiments the different points are sampled according to a plan where t and/or E varies non-linearly and/or in a non-constant manner. The first set of data may have contributions of NMR signals from different resonant species (e.g., resonant tissues) in the sample that produced the first set of data. Apparatus 600 facilitates producing quantitative data concerning the different resonant species (e.g., normal liver, cancerous lesion) in the sample.

MRF apparatus 600 also includes a signal logic 620. Signal logic 620 produces an NMR signal evolution from the acquired NMR signals or the corrected NMR signals. The signal evolution may include a number of NMR signals acquired over a period of time. The signal evolution may have contributions from the different resonant species. Different amounts of resonant species in a sample may cause different signal evolutions to be produced. For example, a portion of a liver that is 100% normal liver tissue may produce a different signal than a portion of a liver that is 100% cancerous lesion.

MRF apparatus 600 also includes a B1 field map logic 640 that stores data associated with a B1 field map associated with a B1 field produced by the NMR apparatus and present in the volume while the first set of data is received.

MRF apparatus 600 also includes a correction logic 650 that produces a first set of corrected data from the first set of data based, at least in part, on the B1 field map. Elements of the first set of data may be adjusted up or down based on the B1 field map. For example, when the B1 field map indicates that an inhomogeneity in the B1 field may have caused a received value to be too high, then the value may be reduced. Additionally, when the B1 field map indicates that an inhomogeneity in the B1 field may have caused a received value to be too low, then the value may be increased.

MRF apparatus 600 also includes a matching logic 630. Matching logic 630 compares the NMR signal evolution or information associated with the NMR signal evolution to a collection (e.g., dictionary, database) of stored signal evolutions to find a match for the acquired NMR signal evolution. In one embodiment, information concerning relative proportions of resonant species that contributed to the selected stored signal evolution is retrievable using the match. The matching logic 630 may perform a match for a signal evolution associated with each pixel or voxel examined.

"Match" as used herein refers to the result of comparing signals. "Match" does not refer to an exact match, which may or may not be found. A match may be the signal that most closely resembles another signal. A match may be the first signal that matches another signal to within a threshold. A match may be found by template matching, pattern matching, or other comparison approaches. The reference information may be, for example, a previously acquired signal evolution, a simulated signal evolution, an item derived from a signal evolution other than the produced NMR signal evolution, and other information. The reference information may include signal evolutions from different tissue types (e.g., healthy, diseased, advanced disease, normal, abnormal). The reference information may include signal evolutions that are formed from combinations of resonant species with combinations of MR parameters.

In one embodiment, the collection of stored signal evolutions includes a signal evolution having information associated with a first resonant species and a second resonant species. The information associated with the first resonant species may be produced by controlling an MR property or properties associated with the first resonant species to be constant or to be within a first known range or ranges. Information associated with the second resonant species may also be produced by controlling an MR property or properties associated with the second resonant species to be constant or to be within a second known range or ranges. When the collection of stored signal evolutions includes signal evolutions associated with a finite, small (e.g., 2, 3) number of resonant species, and when the signals used to produce the signal evolutions are constrained within well-defined ranges, then relative fractions of the resonant species that contributed to the acquired NMR signal evolution may be determined from the matched signal evolution. The relative fractions may be determined in different ways. In one example, the relative fractions may be decoded from the matched signal evolution.

The collection of stored signal evolutions include a signal selected from equations 1 or 2. In other embodiments, the collection of stored signal evolutions include a signal selected from:

$$S_i = R_i E_i (S_{i-1}) \qquad (3)$$

or $$S_i = R_i E_i \sum_{x=1}^{i-1} R_x E_x (S_x) \qquad (4)$$

or $$S_i R_i E_i \prod_{x=1}^{i-1} R_x E_x (S_x) \qquad (5)$$

or $$S_i = \sum_{s=1}^{N_s} R_{s,i} E_{s,i}(S_{s,i-1}) \quad (6)$$

or $$S_i = \sum_{s=1}^{N_s} R_{s,i} E_{s,i} \sum_{x=1}^{i-1} R_{s,x} E_{s,x}(S_{s,x}) \quad (7)$$

or $$S_i = \sum_{s=1}^{N_s} R_{s,i} E_{s,i} \prod_{x=1}^{i-1} R_{s,x} E_{s,x}(S_{s,x}) \quad (8)$$

where $S_0$ is the default or equilibrium magnetization, S, is a vector that represents the different components of the magnetization Mx, My, Mz during acquisition block i, $R_i$ is the combination of rotational effects that occur during acquisition block i, and $E_i$ is the combination of effects that alter the amount of magnetization in the different states for acquisition block i. Equations [1] through [8] may be referred to collectively as the "MRF signal evolution equations".

Figure 7:
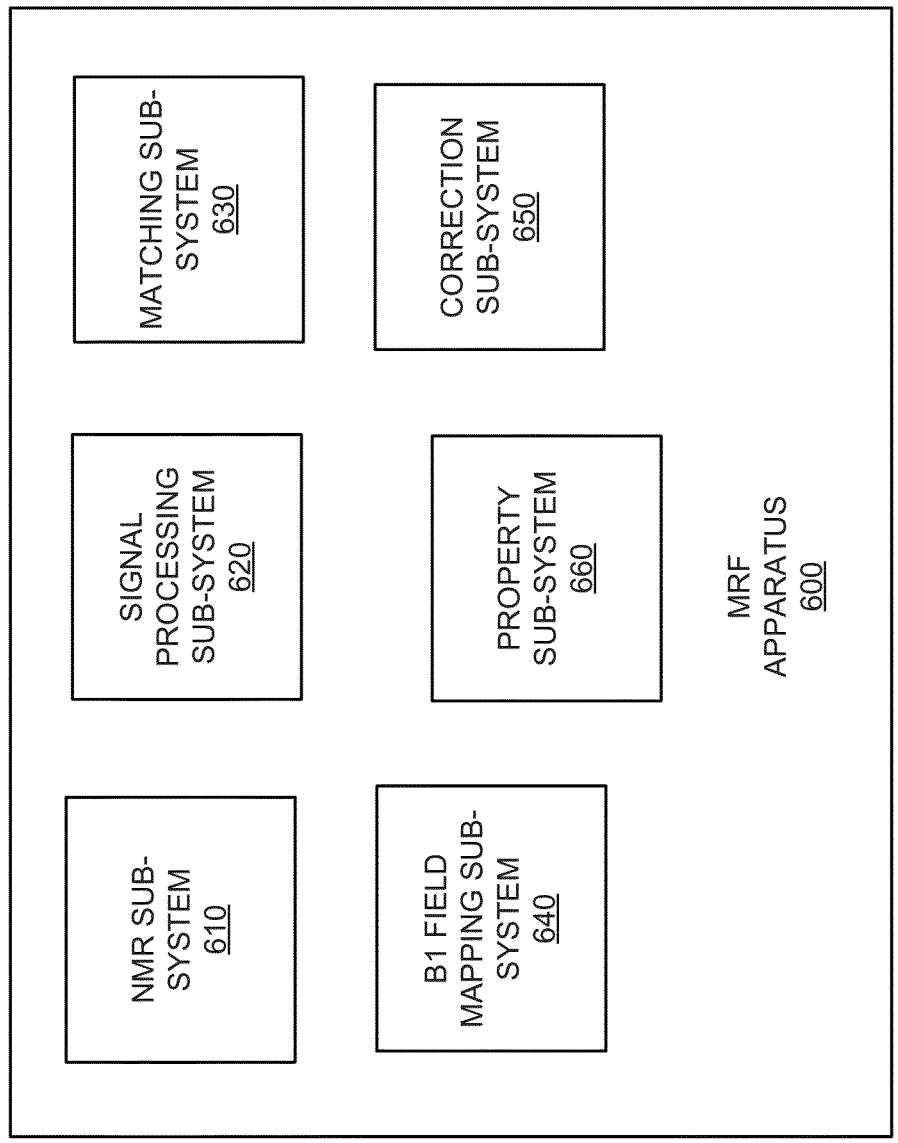
FIG. 7 illustrates an example MR apparatus associated with rapid quantitative abdominal imaging using FISP-MRF.

FIG. 7 illustrates another embodiment of apparatus 600. This embodiment also includes a property logic 660. Property logic 660 identifies the object as having a property based, at least in part, on the relative proportions. The property may describe, for example, whether the object is diseased or healthy, whether the object has T1, T2, or other parameters that fall within a normal range or that fall outside a normal range, or other properties.

While property logic 660 is illustrated as being part of MRF apparatus 600, in one embodiment, the property logic 660 may reside in an apparatus separate from the MRF apparatus 600. In this embodiment, MRF apparatus 600 may provide fraction data to the separate apparatus housing property logic 660.

Figure 8:
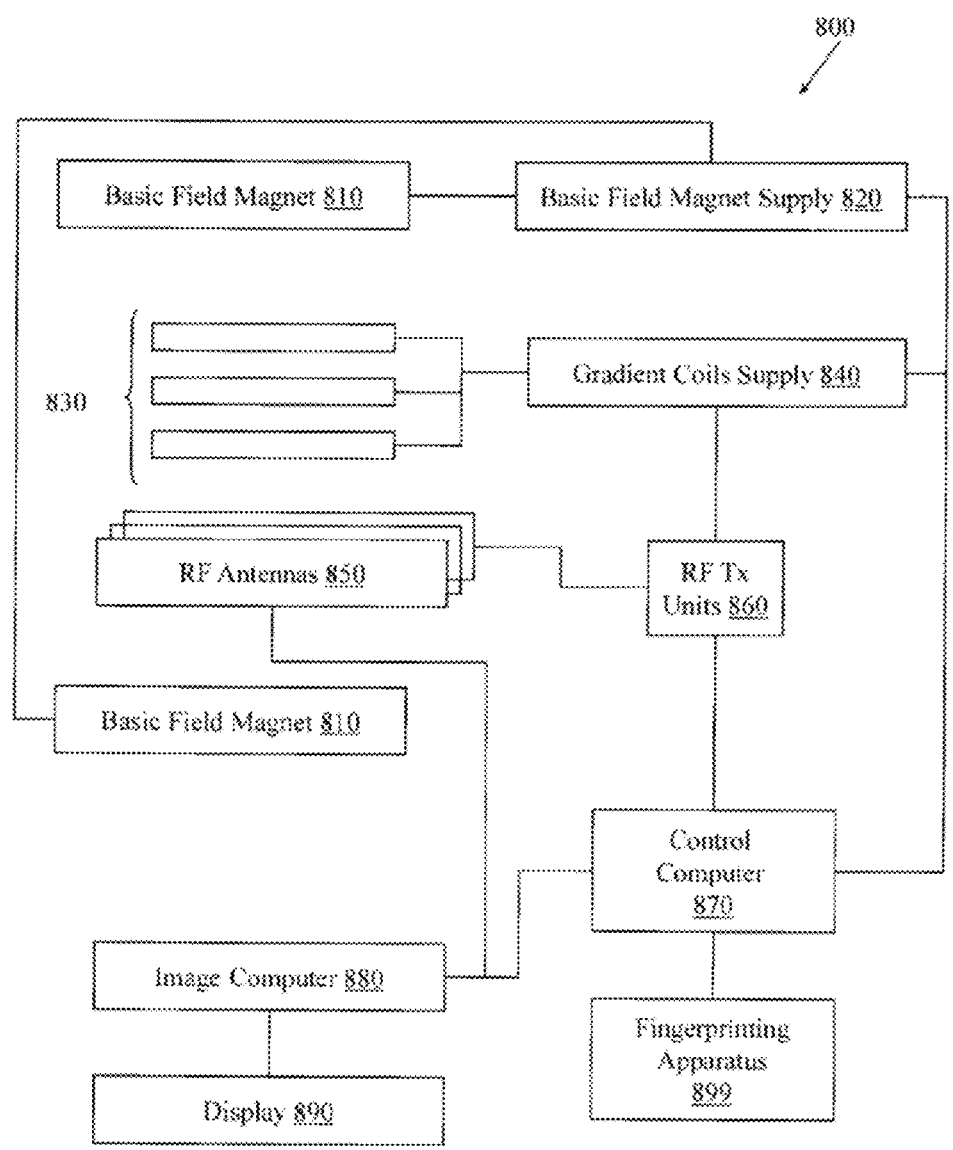
FIG. 8 illustrates an example MR apparatus associated with rapid quantitative abdominal imaging using FISP-MRF.

FIG. 8 illustrates an example MR apparatus 800 having a fingerprinting apparatus 899 that facilitates rapid quantitative abdominal imaging with FISP-MRF. The fingerprinting apparatus 899 may be configured with elements of example apparatus described herein or may perform example methods described herein. While fingerprinting apparatus 899 is illustrated as part of MR apparatus 800, in one example, fingerprinting apparatus 899 may be a separate apparatus or apparatuses.

In one embodiment, fingerprinting apparatus 899 may include a collection logic that collects a received signal evolution from a tissue experiencing NMR in response to an MRF excitation applied to the tissue by the MRI apparatus 800. Fingerprinting apparatus 899 may also include a data store that stores a dictionary of MRF signal evolutions. Unlike conventional systems, members of the dictionary may be specially crafted combinations of constrained information associated with two or more resonant species. Information concerning the composition of the tissue with respect to the two or more resonant species is retrievable using a matched signal evolution.

Fingerprinting apparatus 899 may also include a B1 field map logic that acquires and stores data associated with a B1 field map associated with a B1 field map that is produced by the MRI apparatus 800 and experienced by the sample. The B1 field map may then be used to correct data used to produce the signal evolution.

Fingerprinting apparatus 899 may also include a correction logic that corrects the received signal evolution to account for an inhomogeneous B1 field. The correction logic may correct the data using the B1 field data. The B1 field data may indicate that the received signal evolution needs to be adjusted up or down to account for the inhomogeneous B1 field.

The fingerprinting apparatus 899 may also include a selection logic that selects a matching member of the dictionary that is most closely related to the signal evolution and establishes the matching member as the matched signal evolution. Fingerprinting apparatus 899 may also include a characterization logic that identifies a category for the tissue based, at least in part, on the composition of the tissue as identified using the matched signal evolution. The characterization logic may identify the category for the tissue using a quantitative magnetic resonance based approach. The category for the tissue may distinguish healthy tissue from diseased tissue or may distinguish tissue exhibiting T1 and T2 parameters that are within an expected range from tissue exhibiting T1 and T2 parameters that are outside an expected range.

The apparatus 800 includes a basic field magnet(s) 810 and a basic field magnet supply 820. Ideally, the basic field magnets 810 would produce a uniform B0 field. However, in practice, the B0 field may not be uniform, and may vary over an object being analyzed by the MR apparatus 800. MR apparatus 800 may include gradient coils 830 that emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that generate RF pulses and receive resulting NMR signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the MR signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

While FIG. 8 illustrates an example MR apparatus 800 that includes various components connected in various ways, it is to be appreciated that other MR apparatus may include other components connected in other ways.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 9:
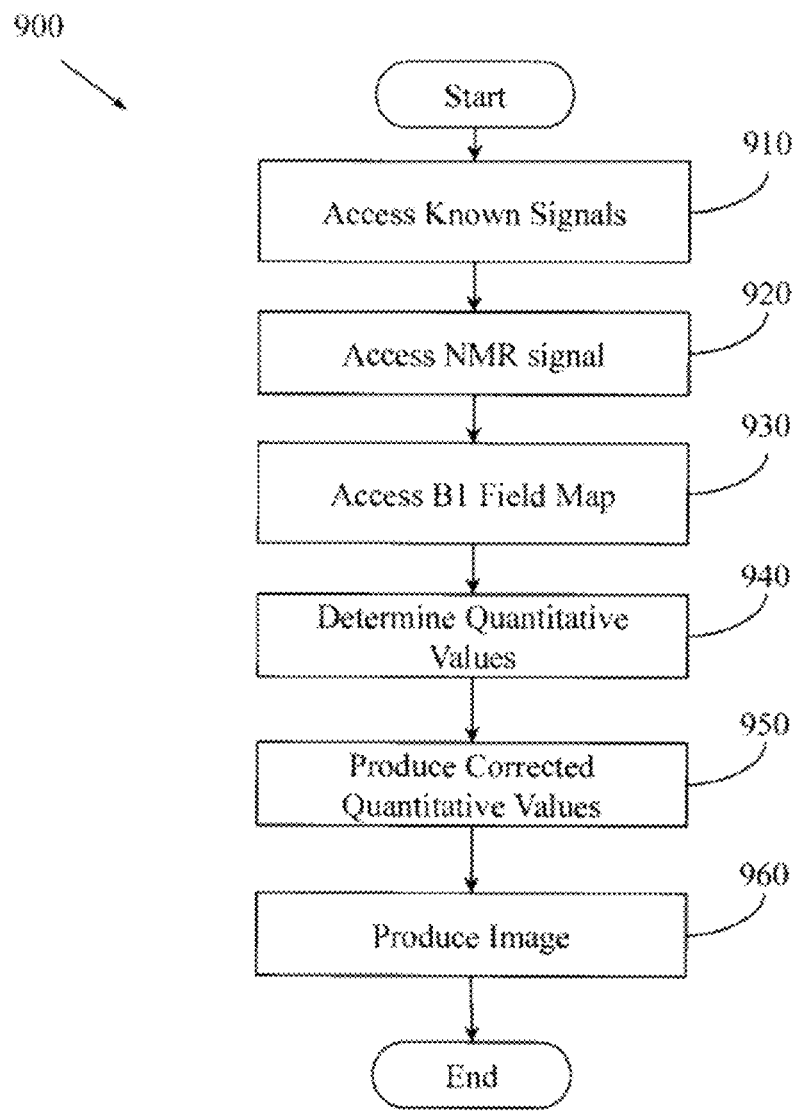
FIG. 9 illustrates an example method associated with rapid quantitative abdominal imaging using FISP-MRF.

FIG. 9 illustrates a method 900 associated with rapid quantitative abdominal imaging using FISP-MRF. Method 900 includes, at 910, accessing a set of known MRF signal evolutions. Unlike conventional systems, a member of the set of known MRF signal evolutions may have been produced by combining constrained data associated with NMR signals associated with a plurality of selected resonant species. In one embodiment, combining the data involves using a forward operation (e.g., weighted sum) for which an inverse operation (e.g., matrix pseudo-inverse) that identifies relative fractions of resonant species associated with the member is available.

Method 900 also includes, at 920, accessing an acquired NMR signal. The acquired NMR signal was produced by a volume that may contain different resonant species in different proportions. For example, the volume may be an abdomen and the resonant species may include fluid, cells, fat, and other resonant species found in the abdomen. The different resonant species simultaneously produce individual NMR signals in response to MRF excitation produced by a FISP-MRF pulse sequence. In one embodiment, the different resonant species may be, for example, normal tissue, differentiated tissue, lesion tissue, or other tissue types.

In one embodiment, the acquired NMR signal may be associated with one of at least one thousand under-sampled images acquired in less than twenty seconds at an under-sampling rate of at least 12. In another embodiment, the acquired NMR signal is associated with one of at least one thousand under-sampled images acquired in less than fifteen seconds at an under-sampling rate of at least 24. In another embodiment, the acquired NMR signal is associated with one of at least one thousand under-sampled images acquired in less than ten seconds at an under-sampling rate of at least 48.

Method 900 also includes, at 930, accessing a B1 field map that characterizes a B1 field produced by the NMR apparatus in the volume. Characterizing the B1 field may include identifying whether the B1 field would cause received signals to be artificially high or low.

Method 900 also includes, at 940, determining quantitative values for two or more parameters of a resonant species in a voxel in the volume based, at least in part, on matching the acquired NMR signal to the set of known MRF signal evolutions. The two or more parameters include T1, T2, and proton density, T1 being spin-lattice relaxation, T2 being spin-spin relaxation.

Method 900 also includes, at 950, producing corrected quantitative values based, at least in part, on the B1 field map. Producing a corrected quantitative value may include, for example, increasing or decreasing the value based on the strength of the B1 field at a location as reported in the B1 field map.

While determining quantitative values and producing corrected quantitative values using the B1 field map are described in that order, in one embodiment, the B1 field map may be used to correct the acquired NMR signal before pattern matching is performed.

Method 900 also includes, at 960, producing an image of at least a portion of the volume. The image may be a T1 weighted image, a T2 weighted image, a proton density image map or other image. The image may be based, at least in part, on quantitative values associated with the selected entry. In one embodiment, producing the image includes performing a reconstruction on the corrected quantitative values using a non-uniform fast Fourier transform (NUFFT). In one embodiment, the reconstruction may be performed using one spiral interleave.

The stored signals and information derived from reference signal evolutions may be associated with a potentially very large data space. The data space for signal evolutions can be partially described by the MRF signal evolution equations.

While FIG. 9 illustrates various actions occurring in serial, it is to be appreciated that various actions illustrated in FIG. 9 could occur substantially in parallel. By way of illustration, a first process could control accessing known signals, a second process could control acquiring NMR signals, a third process could access a B1 field map and correct the NMR signals and a fourth process could produce an image. While four processes are described, it is to be appreciated that a greater and/or lesser number of processes could be employed.

Figure 10:
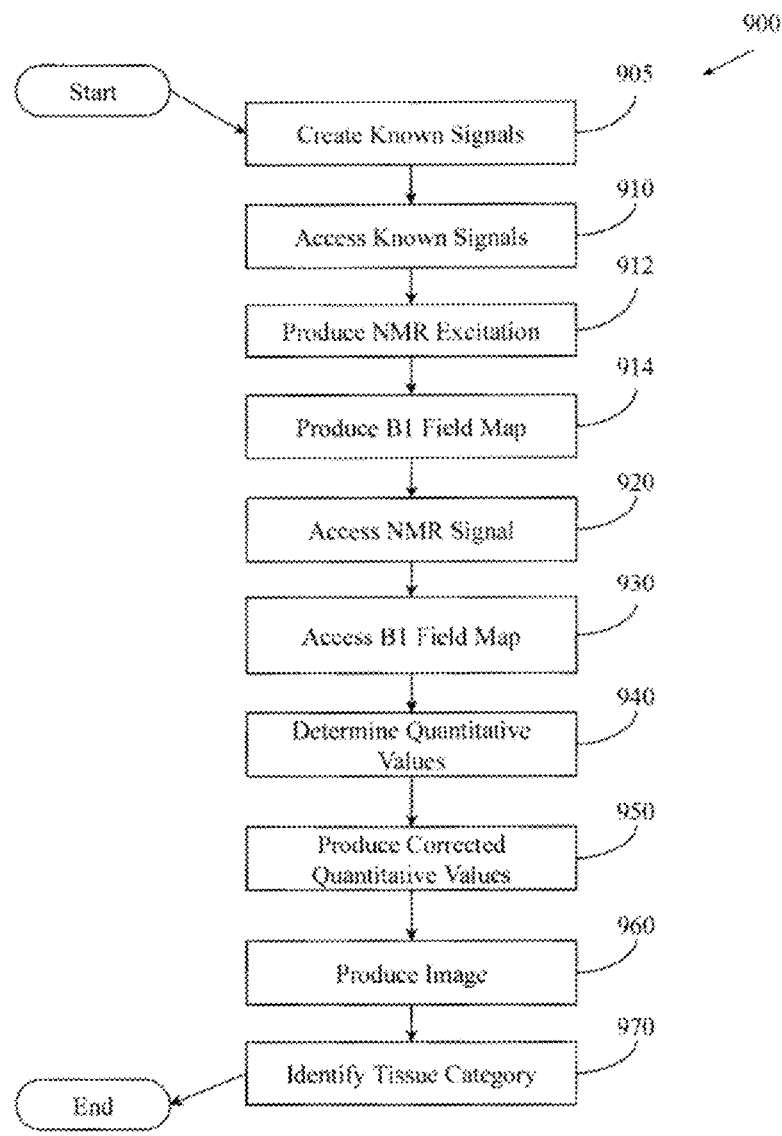
FIG. 10 illustrates an example method associated with rapid quantitative abdominal imaging using FISP-MRF.

FIG. 10 illustrates another embodiment of method 900 (FIG. 9). This embodiment includes actions 910 through 960. However, this embodiment also includes actions 905, 912, 914, and 970.

Action 905 includes creating the collection of stored entries or producing the set of known MRF signal evolutions. Producing the set of known MRF signal evolutions may include combining data associated with NMR signals associated with two or more resonant species using a weighted sum operation. In this embodiment, the inverse operation may be a matrix pseudo-inverse operation.

In one embodiment, producing the set of known MRF signal evolutions at 905 includes producing evolutions based on combinations of T1, T2, and proton density, where T1 varies in a range of 10-3000 ms, T2 varies in a range of 5-500 ms, and B1 varies in a range of 10% to 200% of the B1 field intended to be produced by the NMR apparatus.

In one embodiment, producing the set of known MRF signal evolutions at 905 includes producing data associated with NMR signals by constraining first and second MR parameters associated with different resonant species. In one embodiment, producing the data includes varying a first MR parameter associated with a first resonant species contributing to the NMR signals while holding constant a second MR parameter associated with a second resonant species contributing to the NMR signals. In one embodiment, holding a parameter constant may include allowing the parameter to vary within a tight range (e.g., 1%, 5%) around a central value. The parameters may include T1 and T2. The first resonant species may include, for example, cells found in a human abdomen. The cells may be, for example, healthy cells or diseased cells. The second resonant species may include, for example, water or fluids found in a human abdomen.

In one embodiment, producing the set of known MRF signal evolutions may include producing data associated with models of signal evolutions by holding T1 and T2 constant for a first resonant species, holding T1 and T2 constant for a second resonant species, holding T2 constant for a third resonant species, and varying T1 for the third resonant species. More generally, there may be X parameters for each of Y resonant species. All Y resonant species have the same X parameters. Producing the set of known MRF signal evolutions may include fixing one of the X parameters and sweeping through or varying other of the X parameters. In one embodiment, all the other X parameters may be varied while in another embodiment a subset of interesting X parameters may be varied.

Action 912 includes controlling the MRF apparatus to produce the MRF excitation using a FISP-MRF pulse sequence. Producing the MRF excitation is performed by applying RF energy to the volume in the object in a series of variable sequence blocks. Recall that an MRF sequence block includes one or more excitation phases, one or more readout phases, and one or more waiting phases. Recall also that at least one member of the series of variable sequence blocks differs from at least one other member of the series of variable sequence blocks in one or more sequence block parameters. Example FISP-MRF pulse sequences are illustrated in FIGS. 11-14.

In one embodiment, action 912 includes controlling the NMR apparatus to vary a flip angle associated with the MRF pulse sequence or to vary the acquisition period in the MRF pulse sequence. In one embodiment, the flip angle may be varied in a range from 0 to 54 degrees. In one embodiment, the acquisition time may be varied in a range from 6.1 ms to 9.0 ms. Other ranges of flip angles and acquisition times may be employed. The flip angles and acquisition times may be varied randomly or pseudo-randomly within the ranges.

Action 912 may also include varying other sequence block parameters including, but not limited to, echo time, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, number of gradients applied during a readout portion of a sequence block, amount of RF spoiling, or an amount of gradient spoiling.

Action 912 may also include controlling the MRF apparatus to vary the amount of time between sequence blocks in the series of variable sequence blocks, the relative amplitude of RF pulses in sequence blocks in the series of variable sequence blocks, or the relative phase of RF pulses in sequence blocks in the series of variable sequence blocks.

Method 900 also includes, at 914, producing the B1 field map. In one embodiment, the B1 field map may be produced and acquired using a Bloch-Seigert method. In one embodiment, the B1 field map may be acquired using a spiral readout. In one embodiment, the spiral readout may be a central-out spiral readout. In one embodiment, the B1 field map is acquired in less than two seconds.

In one embodiment, method 900 also includes, at 970, identifying the volume as containing tissue that is a member of a tissue category. The tissue category may be selected based, at least in part, on the quantitative data concerning the resonant species in the volume. In one embodiment, the tissue category may identify whether the tissue is exhibiting properties that are within an expected range or that are outside the expected range.

In one embodiment, the tissue category is cirrhotic liver tissue, benign liver lesion, or malignant liver lesion. In another embodiment, the tissue category is renal tissue functioning above a threshold level or renal tissue functioning below a threshold level.

Figure 11:
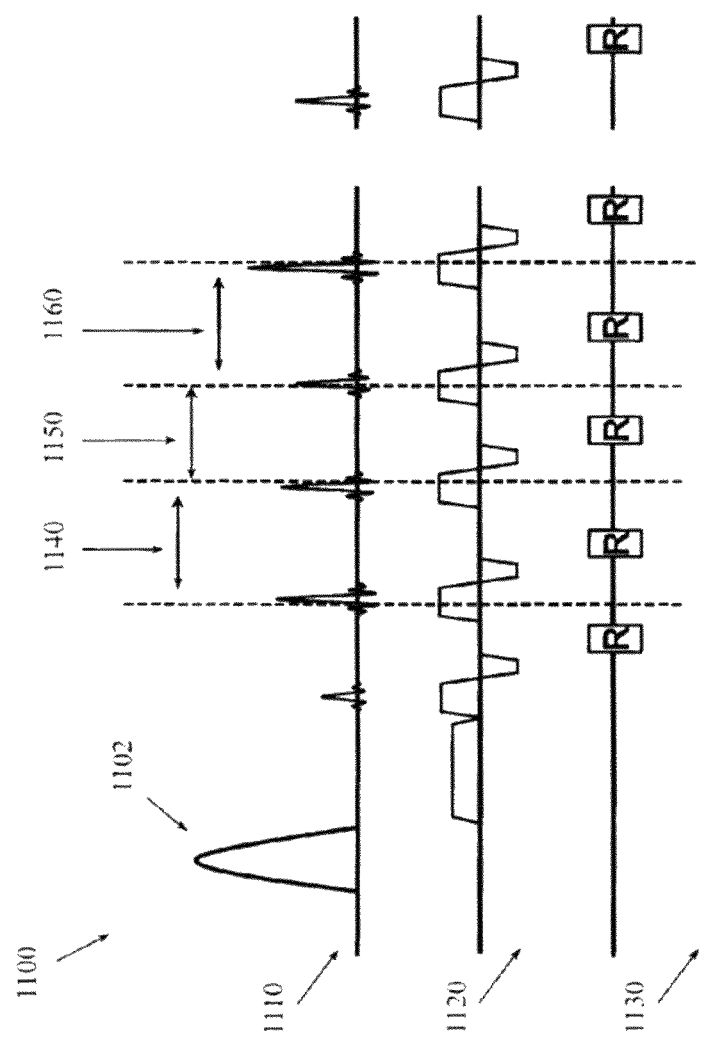
FIG. 11 illustrates an example FISP-MRF pulse sequence.

FIG. 11 illustrates an example MRF-FISP pulse sequence 1100. The MRF-FISP pulse sequence 1100 includes an RF inversion pulse 1102 in the RF energy 1110 applied. While an inversion pulse 1102 is illustrated, in different embodiments there may or may not be an inversion recovery period. The MRF-FISP pulse sequence 1100 includes an unbalanced slice select gradient 1120. While slice select gradient 1120 is illustrated as being unbalanced, in different embodiments other gradients (e.g., x, y, z, phase encoding, frequency encoding, readout encoding) may be unbalanced. The unbalanced slice select gradient 1120 dephases transverse magnetization produced during MRF of the object. In one embodiment, other than T2 or T2* decay, only the unbalanced slice select gradient 1120 dephases the transverse magnetization. Controlling the dephasing of transverse magnetization in this manner improves immunity to artifacts or other distortions caused by an imperfect B0. In the MRF-FISP pulse sequence 1100, the acquisition periods 1140, 1150, and 1160 do not have to be of equal duration. However, in one embodiment, the acquisition periods 1140, 1150, and 1160 will be equal.

The MRF-FISP algorithm can be manipulated to generate different contrasts by varying flip angles or acquisition periods used in the MRF-FISP pulse sequence 1100. Thus, in one embodiment, to generate unique signal shapes for different tissue types that may be examined using MRF-FISP, example apparatus and methods may vary flip angle or acquisition time in different acquisition periods. In one embodiment, a flip angle or acquisition time may be varied from one acquisition period to the next.

Figure 12:
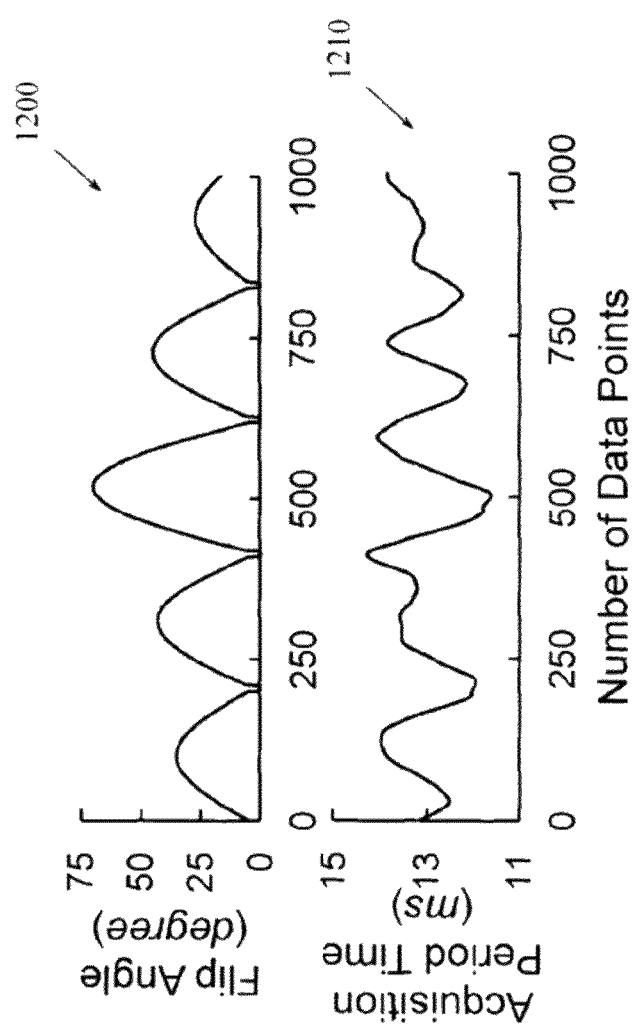
FIG. 12 illustrates flip angles and acquisition time periods associated with an example FISP-MRF pulse sequence.

FIG. 12 illustrates one example manipulation of flip angle 1200 and acquisition time 1210 in an example MRF-FISP pulse sequence. In one embodiment, a sinusoidal variation of flip angles and acquisition times per acquisition period may be employed in a Perlin noise pattern.

The unbalanced gradient 1120 illustrated in pulse sequence 1100 (FIG. 11), combined with the variations in flip angle 1200 and acquisition period 1210 illustrated in FIG. 12 produced 2π dephasing within one voxel. Achieving 2π dephasing or more within one voxel makes data acquired using the MRF-FISP sequence insensitive to B0 inhomogeneity. While 2π dephasing is described, other dephasing (e.g., 8π) may be employed.

Figure 13:
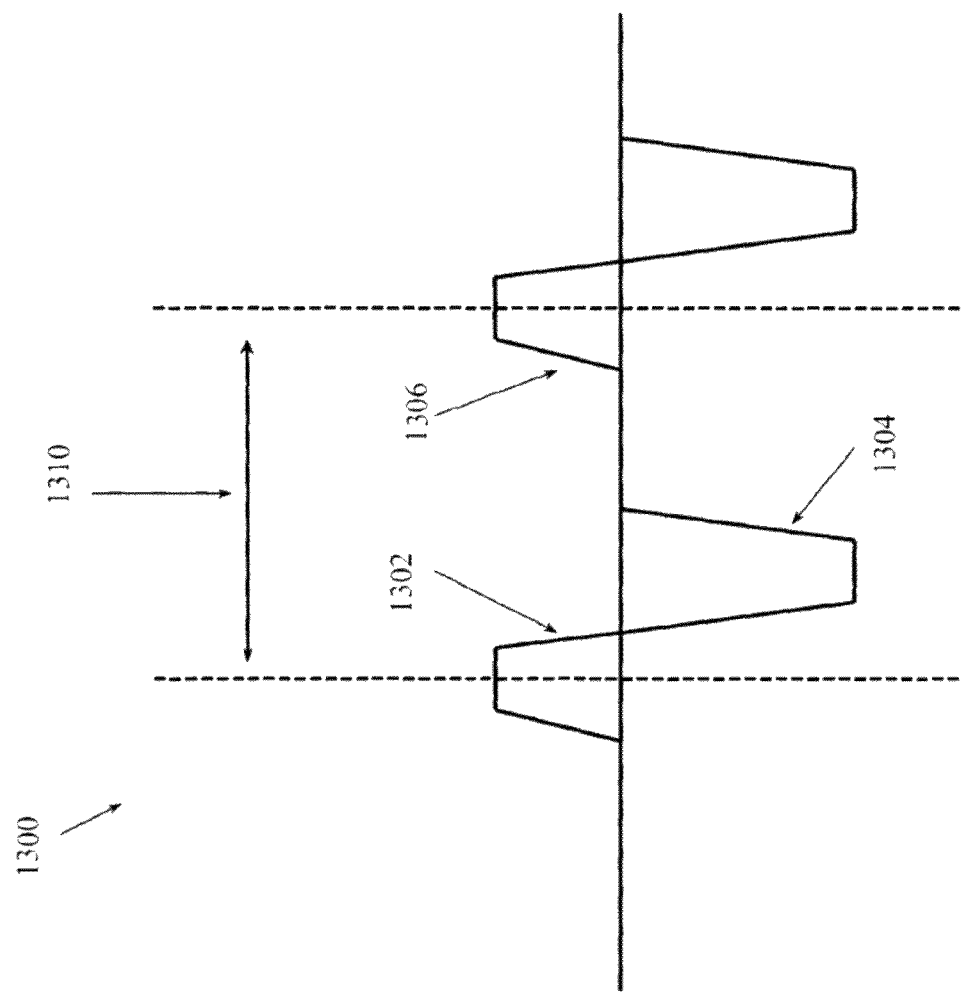
FIG. 13 illustrates a portion of an example FISP-MRF pulse sequence.

FIG. 13 illustrates a portion of an MRF-FISP pulse sequence 1300. One acquisition period 1310 is illustrated. The area 1302 usually cancels the area 1304 leaving the area 1306 as residual.

Figure 14:
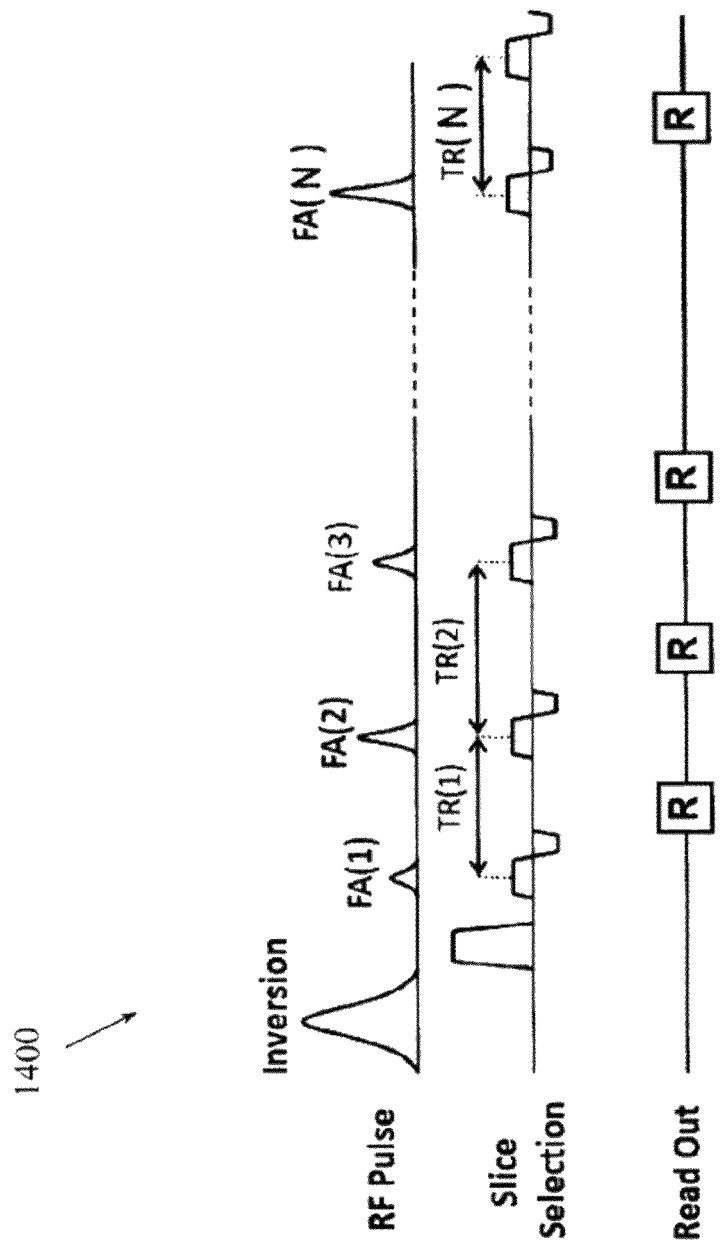
FIG. 14 illustrates an example FISP-MRF pulse sequence.
Figure 15:
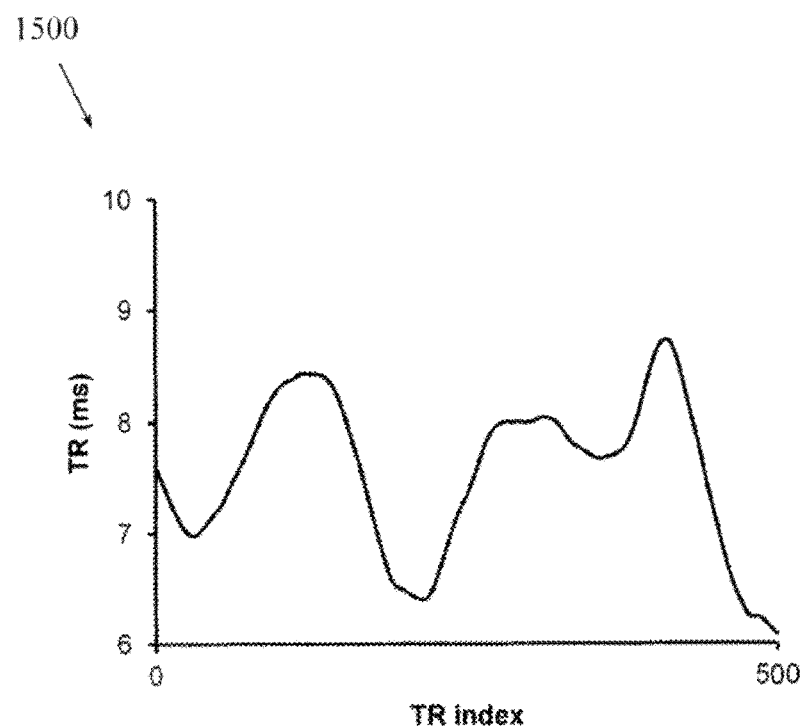
FIG. 15 illustrates an example acquisition pattern for repetition time.
Figure 16:
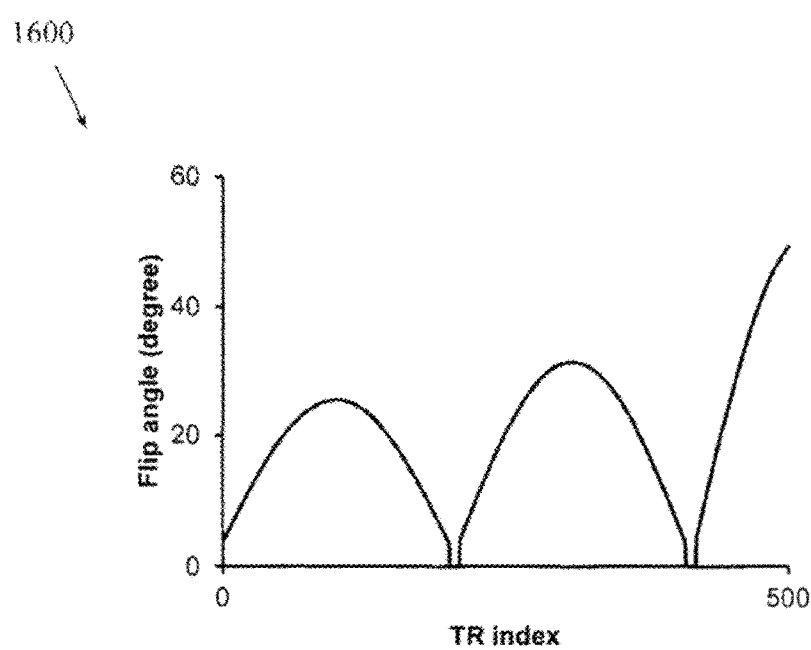
FIG. 16 illustrates an example acquisition pattern for flip angles.
Figure 17:
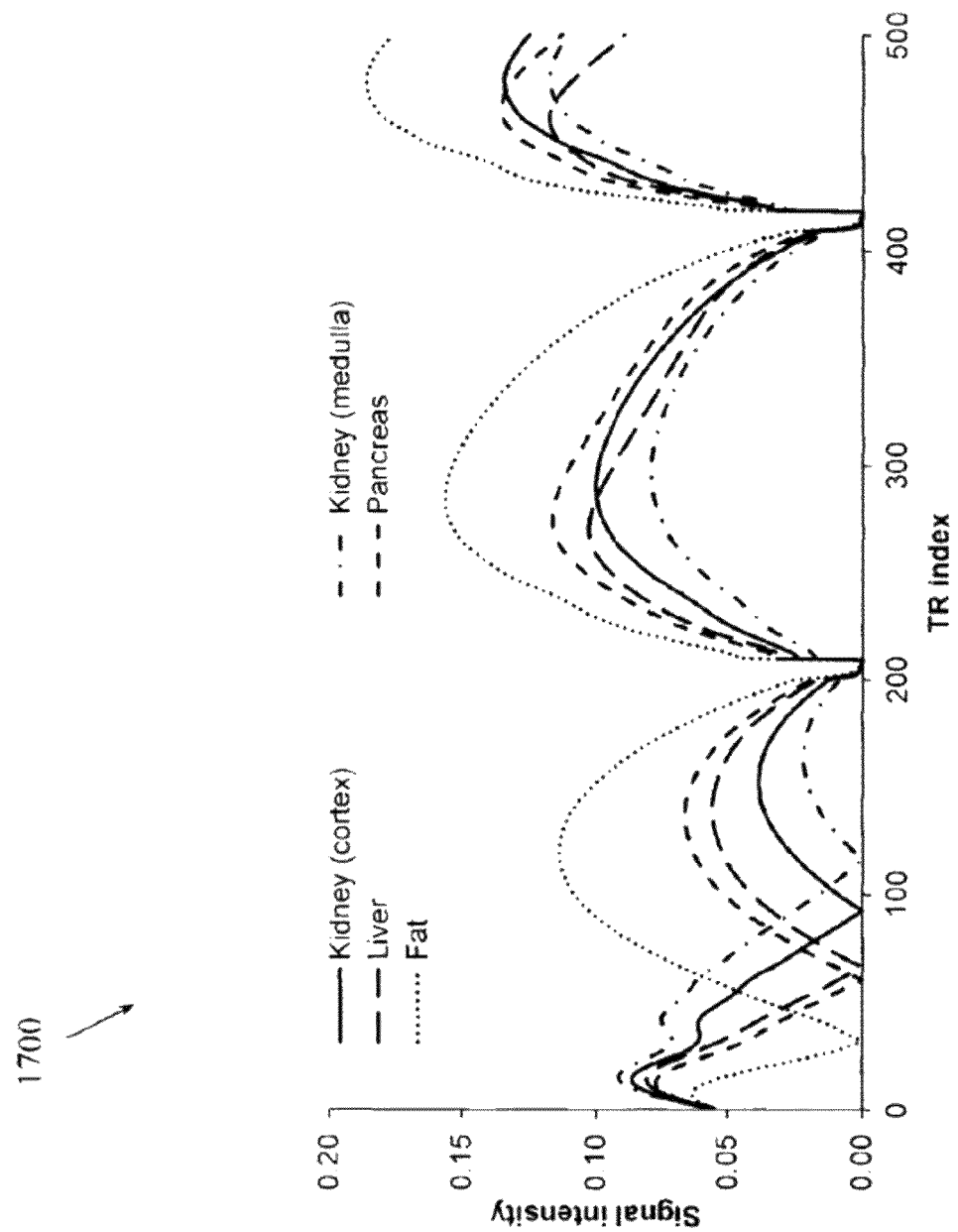
FIG. 17 illustrates simulated signal evolution curves from five different abdominal tissues.

Example apparatus and methods use FISP-MRF. FIG. 14 illustrates how an adiabatic inversion pulse is applied first, and a FISP data acquisition is applied afterwards using pseudorandomized repetition times and flip angles. One example acquisition pattern for repetition time in the FISP-MRF scan is shown in FIG. 15. One example acquisition pattern for flip angles in the FISP-MRF scan is shown in FIG. 16. In one embodiment, the repetition time may vary between 6.1 ms and 9.0 ms and the flip angle may vary between 0° and 54°. Simulated signal evolution curves from five different abdominal tissues, including hepatic parenchyma, pancreas, fat, renal cortex and medulla, that were acquired with this approach are shown in FIG. 17. Since these tissues have different characteristic T1 and T2 values, different signal evolution patterns were observed, indicating the suitability of the MRF approach to differentiate various tissue types in the abdomen.

Second Technique

As described above, magnetic resonance fingerprinting (MRF) is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when RF energy is applied to a volume that has both bone and muscle tissue, then both the bone and muscle tissue will produce an NMR signal. However the "bone signal" represents a first resonant species and the "muscle signal" represents a second resonant species and the two will be different. These different signals from different species can be collected simultaneously over a period of time to collect an overall "signal evolution" for the volume.

The random, pseudorandom, or otherwise varied measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE"), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. In some instances, the acquisition parameters can be varied according to a non-random or a non-pseudorandom pattern that otherwise results in signals from different materials or tissues to be spatially incoherent, temporally incoherent, or both.

From these measurements, MRF processes can be designed to map a wide variety of parameters that may be mapped individually or simultaneously. Examples of such parameters include, but are not limited to, longitudinal relaxation time ($T_1$), transverse relaxation time ($T_2$), main or static magnetic field map ($B_0$), and proton density (PD). Unlike conventional MR systems, tissue property maps may be generated simultaneously using MRF. Thus, rather than subjecting a patient to multiple serial acquisitions that may take a half hour or more, the patient may experience a much shorter time in the bore. Similarly, rather than making a radiologist wait for multiple images that are produced serially (e.g., a first pulse sequence to generate a $T_1$ map, a second pulse sequence to generate a $T_2$ map), the radiologist may be provided with maps that are produced simultaneously from the MRF data. MRF is generally described in U.S. Pat. No. 8,723,518 and Published U.S. Patent Application No. 2015/0301141, each of which is incorporated herein by reference in its entirety.

The signal evolutions that are acquired with MRF techniques are compared with a dictionary of signal models, or templates, that have been generated for different acquisition parameters from magnetic resonance signal models, such as Bloch equation-based physics simulations. The dictionary may also comprise a series of previously acquired known evolutions. This comparison allows estimation of the physical parameters, such as those mentioned above. As an example, the comparison of the acquired signals to a dictionary are typically performed using any a matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T1, T2, D) M_0; \quad (9)$$

where SE is a signal evolution, $N_S$ is a number of spins, $N_A$ is a number of sequence blocks, $N_{RF}$ is a number of RF pulses in a sequence block, $\alpha$ is a flip angle, $\Phi$ is a phase angle, $R_i(\alpha)$ is a rotation due to off resonance, $R_{RF_{ij}}(\alpha, \Phi)$ is a rotation due to RF differences, R(G) is a rotation due to a gradient, T1 is a spin-lattice relaxation, T2 is a spin-spin relaxation, D is diffusion relaxation, $E_i$(T1, T2, D) is decay due to relaxation differences, and $M_0$ is the default or natural alignment to which spins align when placed in the main magnetic field.

While $E_i$(T1, T2, D) is provided as an example, in different situations, $E_i$(T1, T2, D) may actually be $E_i$(T1, T2, D . . . ) or $E_i$(T1, T2 . . . ). Also, the summation on j could be replaced by a product on j.

The dictionary may store signals described by:

$$S_i = R_i E_i(S_{i-1}) \quad (10);$$

where $S_0$ is the default or equilibrium magnetization, $S_o$ is a vector that represents the different components of magnetization $M_x$, $M_y$, $M_z$ during acquisition block i, $R_i$ is a combination of rotational effects that occur during acquisition block i, and $E_i$ is a combination of effects that alter the amount of magnetization in the different states for acquisition block i. In this situation, the signal at acquisition block i is a function of the previous signal at acquisition block i−1. Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

As described above, quantitative parametric mapping is extremely challenging in the abdomen due to the anatomy of the region (e.g., large organs), field inhomogeneities, and deleterious effects of respiratory motion. The techniques described in FIGS. 1-23 offer several advantages over conventional techniques such as simultaneously providing multiple quantitative maps of the abdomen, and the potential to detect and characterize lesions during a single breath hold of a patient. However, one potential drawback of the techniques provided in FIGS. 1-23 is that the patient is required to hold their breath (e.g., for 20 seconds or less) during data acquisition of a 2D slice. This can make clinical applications that require volumetric coverage challenging or potentially unrealistic due to scan time constraints. Other limitations of breath holding techniques can include motion artifacts induced by patients moving during image acquisition or artifacts induced by a patient being incapable of holding their breath during data acquisition. Here, the present disclosure extends the techniques described above with respect to FIGS. 1-23 to provide a navigated free-breathing 3D acquisition with volumetric coverage for quantitative abdominal imaging.

Figure 24:
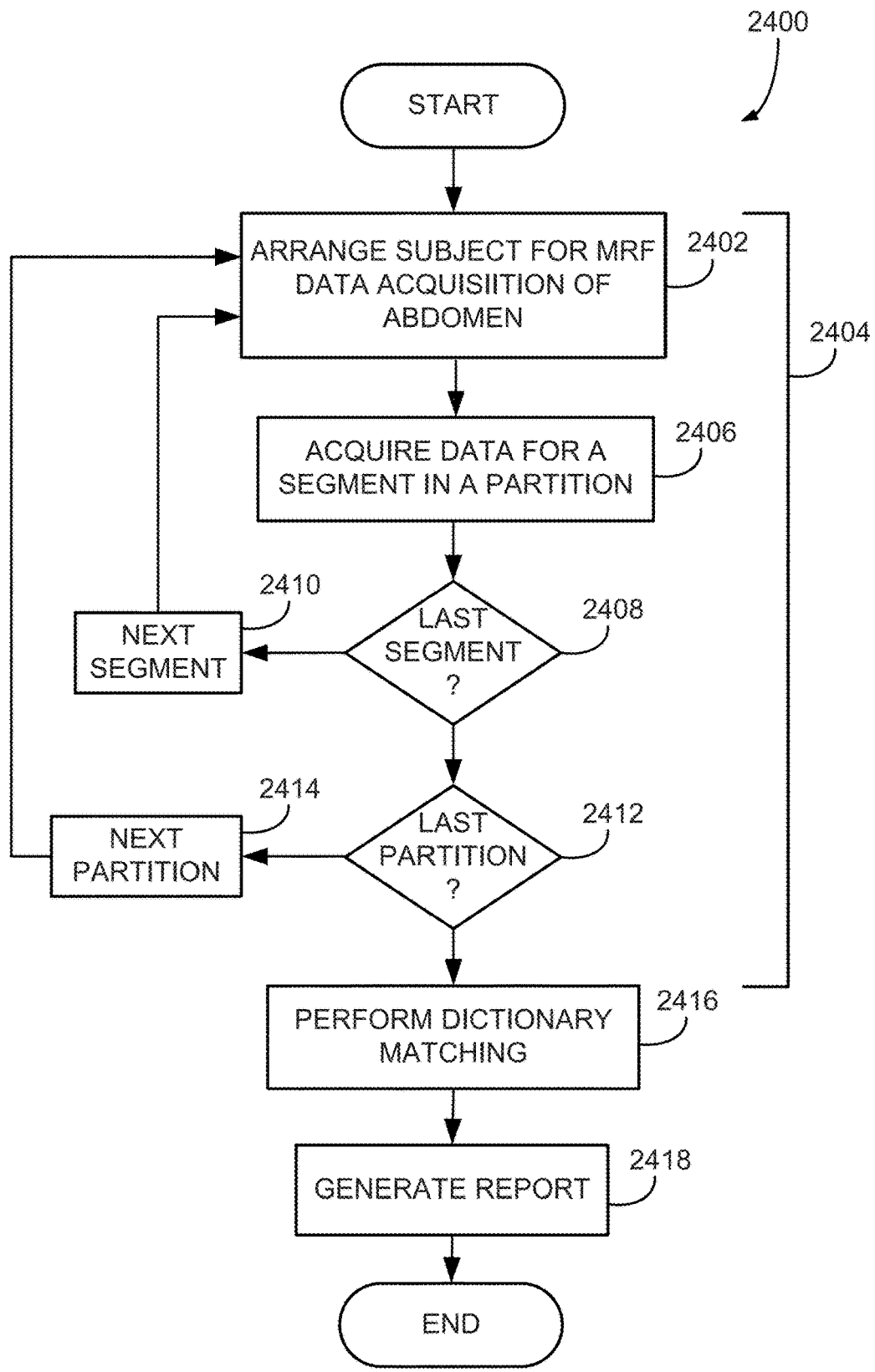
FIG. 24 is a flow chart setting forth the steps of a pulse sequence in accordance with the present disclosure.

Referring to FIG. 24, a flow chart is provided that provides some, non-limiting example steps of a process 2400 for performing a quantitative and three-dimensional (3D) MRF pulse sequence in accordance with the present disclosure. The process begins at process block 2402 by arranging a subject in a system capable of performing an MRF process to acquire MRF data from an abdomen of the subject, such as system 2700 described in FIG. 28. As indicated generally at 2404, a pulse sequence is performed to acquire the desired MRF data such as from a subject's abdomen while the subject is freely breathing.

In one embodiment, the pulse sequence 2404 includes a steady-state free precession (SSFP)-based pulse sequence (often referred to as a FISP-based pulse sequence by Siemens). However, this pulse sequence may be modified for 3D abdominal imaging. To modify the pulse sequence for 3D abdominal imaging, 3D encoding is performed sequentially through partitions and data for each partition is acquired within a cycle of segmented acquisition blocks (e.g., 2 acquisition blocks, 3 acquisition blocks, 4 acquisition blocks, 8 acquisition blocks, 16 acquisition blocks, n acquisition blocks). In one embodiment, the 3D abdominal imaging volume may be, for example, spatially encoded with phase encoding along two perpendicular spatial directions with frequency encoding along the third. The additional partition-encoding gradient allows for acquisition of three-dimensional slabs of the patient, where each slab is composed of two-dimensional partitions or slices taken along the additional partition-encoding gradient. Alternatively, in another aspect, phase encoding can be abandoned and a 3D-projection acquisition may be used, where frequency-encoding varies in three dimensions by incrementally changing the azimuthal and polar angles.

When performing the pulse sequence 2404, the pulse sequence may be designed to acquire data for a given segment in a given partition at process block 2406. In particular, effectuating the pulse sequence includes controlling an NMR apparatus to apply RF energy to a volume in an object being imaged. The volume may contain one or more resonant species. For example in the case of 3D abdominal imaging, the resonant species may include, but are not limited to, tissue, fat, water, hydrogen, and bone.

The RF energy may be applied in a series of variable sequence blocks. Sequence blocks may vary in a number of parameters including, but not limited to, echo time, flip angle, phase encoding, frequency encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

Depending upon the imaging or clinical need, two, three, four, or more parameters may vary between sequence blocks. The number of parameters varied between sequence blocks may itself vary. For example, the first sequence block 1 may differ from the second sequence block in five parameters, the second sequence block may differ from the third sequence block in seven parameters, and the third sequence block may differ from the fourth sequence block in two parameters. One skilled in the art will appreciate that there are a very-large number of series of sequence blocks that can be created by varying this large number of parameters. A series of sequence blocks can be crafted so that the series have different amounts (e.g., 1%, 2%, 5%, 10%, 50%, 99%, 100%) of unique sequence blocks as defined by their varied parameters. A series of sequence blocks may include more than ten, more than one hundred, more than one thousand, more than ten thousand, and more than one hundred thousand sequence blocks. In one example, the only difference between consecutive sequence blocks may be the number or parameters of excitation pulses.

Regardless of the particular imaging parameters that are varied or the number or type of sequence blocks, the RF energy applied at process block 2406 during a sequence block is configured to cause different individual resonant species to simultaneously produce individual NMR signals or unique signal evolutions. Unlike conventional imaging techniques, in an MRF pulse sequence in accordance with the present disclosure, at least one member of the series of variable sequence blocks will differ from at least one other member of the series of variable sequence blocks in at least N sequence block parameters, N being an integer greater than one. As noted above, N may be a number greater than one. One skilled in the art will appreciate that the signal content of a signal evolution may vary directly with N. Thus, as more parameters are varied, a potentially richer signal is retrieved. Conventionally, a signal that depends on a single parameter is desired and required to facilitate imaging. Here, acquiring signals with greater information content facilitates producing more distinct and thus more matchable signal evolutions.

The pulse sequence may apply members of the series of variable sequence blocks according to a partially random or pseudo-random acquisition plan configured to under-sample the object at an under-sampling rate R. In different situations, rate R may be, for example, two, four, or greater.

After each sequence block or segment is acquired, a check is made at decision block 2408 to determine if the acquired segment is the last segment. If not, at process block 2410, the next segment is acquired. If so, at decision block 2412, a determination of whether the current partition is the last partition is made. If not, the process moves to the next partition at process block 2414, until data from the last segment of the last partition is acquired.

Figure 25:
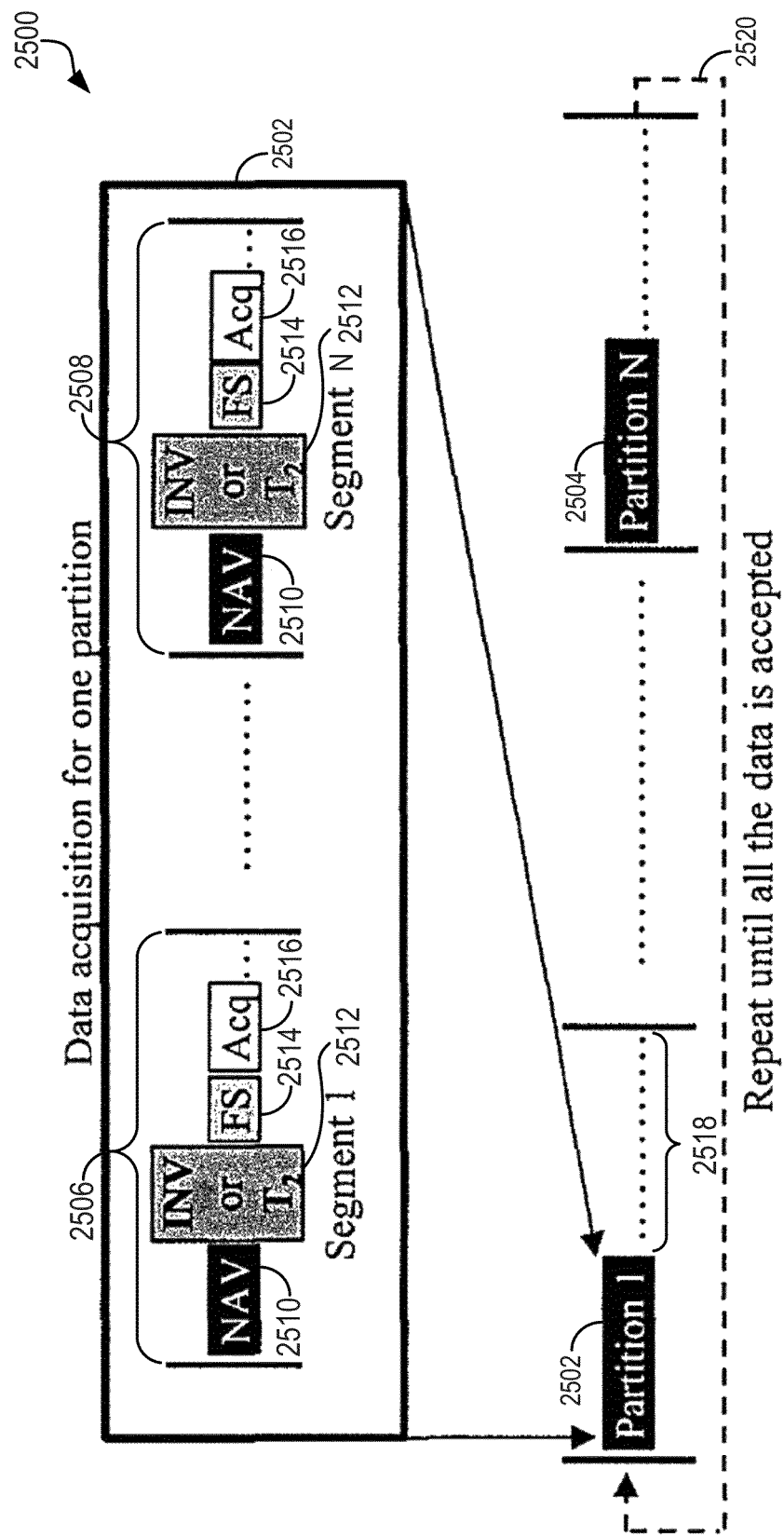
FIG. 25 is a pulse sequence diagram illustrating one non-limiting example of a process in accordance with the present disclosure.

Referring to FIG. 25, one non-limiting example of a three-dimensional (3D) MRF pulse sequence 2500 in accordance with the present disclosure is illustrated. The 3D MRF pulse sequence 2500 achieves 3D encoding sequentially using multiple partitions 2502, 2504, and accurately estimates respiratory motion during the magnetic resonance fingerprinting acquisition by applying a navigator module 2510. Accurate extraction of motion information from navigator signals in the abdomen is a challenging task due to respiratory motion, and is further confounded by continuous signal variation during MRF acquisitions. For each partition 2502, 2504 data acquisition is performed in a cycle comprised of multiple segments 2506, 2508, and the navigator module 2510 may be applied before or after the acquisition of each segment 2506, 2508. One skilled in the art would appreciate that more segments could be used than those illustrated in FIG. 25, such as, three or more segments, four or more segments, six or more segments, eight or more segments, sixteen or more segments, or more.

For data acquisition from each segment 2506 and 2508, a plurality of modules are performed within each partition. In practice, for each segment 2506, 2508 at least two types of data are acquired. Namely, navigator data is acquired by the navigator module 2510 and MRF data is acquired by the acquisition module 2516. The navigator data is used to determine if the MRF data acquired by acquisition modules 2516 should be accepted or rejected based on whether the acquired MRF data within each segment 2506, 2508 meets a predetermined condition. For example, the predetermined condition may relate to a parameter that defines an acceptable level of patient respiratory motion. Thus, the navigator module 2510 may be used to reduce MRI artifacts (e.g., ghosting, blurring, and image misregistration) within the abdomen that are induced by patient respiratory motion.

To this end, the acquisition process is repeated through all partitions, from partition 2502 through partition 2504, until all data within each partition 2502, 2504 is determined to be accepted based on the navigator data acquired using the navigator module 2510. For example, the data acquired for a given partition 2502, 2504 is considered against the navigator data to determine if it meets a predetermined condition. The predetermined condition as one non-limiting example may be a substantial consistency of spatial location. Substantial consistency of spatial location may be determined by assessing the navigator data to conclude that the volume being imaged in the abdomen is not currently in motion despite free breathing. For example, the navigator module 2510 may track navigator data from segment to segment to ensure that significant translation or rotation has not occurred. The predetermined condition may be defined by an acceptance window such as ±3 mm. As another non-limiting example, substantial consistency of spatial location may be determined by assessing the navigator data to trigger the acquisition module 2516 to be performed when the movement of the volume in the abdomen reaches a desired location during motion caused by free breathing (e.g., end or beginning of exhalation position). Other predetermined conditions may include thresholds or criteria for evaluating data consistency from adjacent partitions, indications of motion artifacts, or the like.

If data at a given partition 2502, 2504 is not accepted, for example due to motion artifacts, the pulse sequence is repeated at loop 2520. To reduce the acquisition time during this process, the cycle for a given partition 2502, 2504 may not be repeated once all segments are accepted based on the navigator data acquired using the navigator module 2510. In one non-limiting example, the navigator module 2510 may include a spin echo based cross-pair excitation to track the position of the diaphragm (e.g., position of the dome of the left hemi-diaphragm). In one example implementation the navigator module 2510 may include the following parameters: spin-echo based cross-pair; position: dome of the left hemidiaphragm; acceptance window=±3 mm. Other non-limiting imaging parameters may include: FOV, 420×420 mm; matrix, 224×224; partition thickness, 3 mm; number of partitions, 8. Suitable navigator modules 2510 may include a pencil-beam navigator or a module using single linear readout in a superior-inferior direction.

The acquisition module 2516 may include a FISP readout configured with variable flip angles to achieve varied imaging parameters between sequence blocks that elicit a series of signal evolutions within the imaging volume. In one non-limiting example, the flip angle may range in a randomized, pseudorandomized, or otherwise varied fashion from 4° to 15°. Employing a low and varied flip angle (e.g., 4° to 15°) reduces the sensitivity of the method to B1 field inhomogeneity, and allows for accurate data to be acquired without the use of a B1 field inhomogeneity correction technique. As multiple partitions 2502, 2504 are acquired, the resulting data fills a 3D k-space matrix. The data acquisition modules 2516 may be further configured to sample the 3D k-space matrix using a stack of projections or spirals. For example, the resulting 3D k-space data may be sampled using multiple uniform-density spiral interleaves. In one non-limiting example, 48 spiral interleaves may be acquired over 48 TRs. A high in-plane reduction factor of 48 may also be used, so only one spiral arm is acquired for each partition within a 3D volume.

In some implementations, the TR may be minimized and held constant to maximize the number of images acquired. In one non-limiting example, the TR may be held constant (e.g., at 5.84 ms). As in a traditional MRF acquisition, a high in-plane acceleration factor may be used, so only one spiral interleaf is acquired for each partition within a volume. In one non-limiting example, such acceleration may be a factor of 48. At the end of each cycle to perform data acquisition in a given partition 2502, 2504, a pause 2518 can be observed for the recovery of the spins to the equilibrium. In one non-limiting example, the pause 2518 may be 5 seconds in duration.

In some embodiments, each segment 2506, 2508 may be further configured with a magnetization preparation module 2512 and a fat suppression module 2514. Suitable magnetization preparation modules 2512 may employ either a non-selective inversion pulse or a composite T2-preparation module such as a Malcom-Levitt (MLEV) algorithm. In the case of the former, one non-limiting example of module parameters includes an interval time (TI) of 21/100/250/400 ms. In the case of the latter, one non-limiting example of the echo time (TE) may be 50/90 ms.

The above described variable segments, or variable sequence blocks, within the partitions 2502, 2504 are configured to elicit a series of spatially incoherent signal evolutions from the resonant species within the region of interest. Referring back to FIG. 24, at process block 2416, the acquired spatially incoherent signal evolutions are then compared to a dictionary that includes "stored" signal evolutions therein. The "stored" or "known" signal evolutions may be generated, for example, using Bloch-like physics equations to estimate possible combinations of parameters for a T1 range, T2 range, proton density range, and the like. These three are but examples of tissue properties. Other properties or corollary properties, such as T2*, can be considered as well. In the above non-limiting example, a dictionary comprising a series of "stored" signal evolutions was calculated using Bloch equations with a wide range of $T_1$ (as a non-limiting example, 100-3000 ms) and T2 values (as a non-limiting example, 10-500 ms).

In any case, the signal intensity time course of each voxel within the highly under sampled volumes are then matched to an entry in the dictionary using pattern matching, which yields the underlying tissue parameters. Based thereon, a report is generated at process block 2418. In some embodiments, multiple reports may be generated simultaneously from the acquired data. The reports may include anatomical images or maps showing the underlying tissue parameters identified from the dictionary matching at process block 2416 with reduced or no motion artifacts. More particularly, the report may provide quantitative tissue parameters correlated with anatomical images or maps. Alternatively, the report may simply include written text or the like that provide information on the underlying tissue, such as quantitative indications of the tissue parameters.

The above-described pulse sequence and techniques was tested with three normal volunteers (M:F, 2:1; mean age, 30.3 years) and the average acquisition time for 8 partitions was ~7.8±2.6 min. A 2D breath-hold scan (~16 sec) with the same FOV and matrix size (slice thickness, 5 mm) was also performed using the same flip-angle pattern and preparation modules as a comparison.

Figure 26:
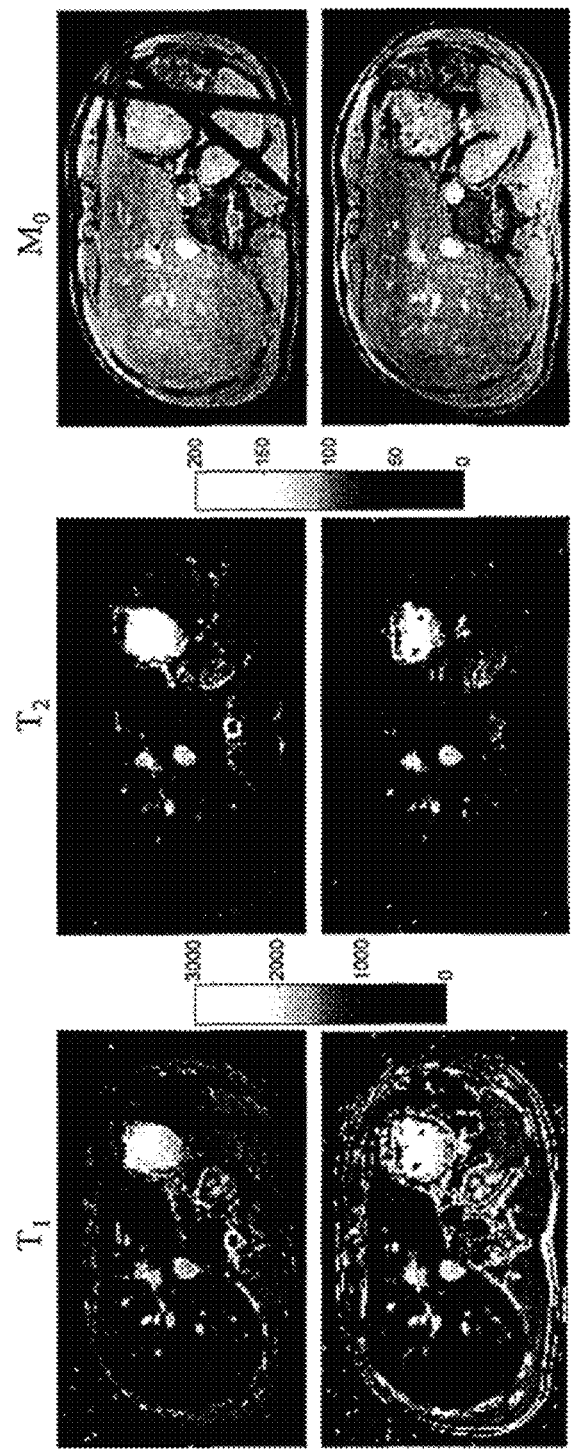
FIG. 26 are representative images produced in accordance with the present disclosure.

FIG. 26 presents the T1, T2, and proton density maps from one slice of a 3D acquisition. Quantitative maps acquired from a 2D breath-hold scan at the same slice location are also presented for comparison. The free-breathing 3D scan provides quantitative maps with no motion artifacts, which matches well with the maps from the 2D breath-hold scan.

Figure 27:
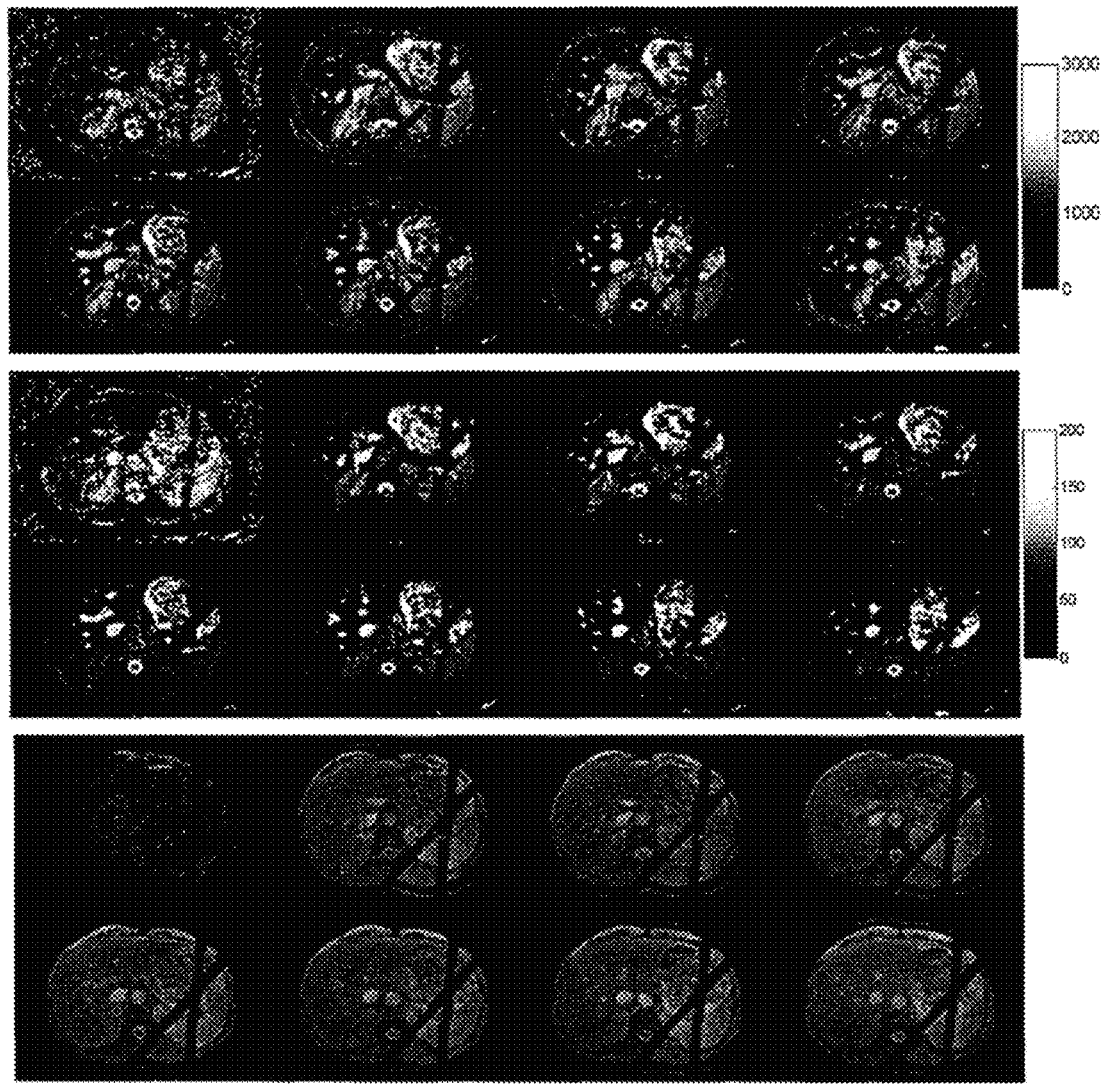
FIG. 27 are further representative images produced in accordance with the present disclosure.

FIG. 27 shows representative 3D T1, T2, and proton density maps acquired from a different volunteer. The summary of T1 and T2 relaxation times for multiple abdominal organs acquired with the proposed technique at 3T is presented in Table 2, which is in close agreement with the literature.

TABLE 2

| Tissue | $T_1$ (ms) | | $T_2$ (ms) | |
|---|---|---|---|---|
| | This study | Literature | This study | Literature |
| Liver | 795 ± 58 | (809 ± 71)[5] | 30 ± 3 | (34 ± 4)[5] |
| | | (824 ± 61)[6] | | (42 ± 3)[7] |
| | | (812 ± 64)[7] | | |
| Kidney - Medulla | 1719 ± 110 | (1545 ± 142)[5] | 76 ± 19 | (81 ± 8)[5] |
| | | (1610 ± 55)[6] | | |

TABLE 2-continued

| Tissue | $T_1$ (ms) | | $T_2$ (ms) | |
|---|---|---|---|---|
| | This study | Literature | This study | Literature |
| Kidney - Cortex | 1369 ± 43 | (1142 ± 154)[5] | 73 ± 11 | (76 ± 7)[5] |
| | | (1194 ± 88)[6] | | |
| Spleen | 1278 ± 73 | (1328 ± 31)[5] | 65 ± 10 | (61 ± 9)[5] |
| | | (1251 ± 95)[6] | | |
| Skeletal muscle | 1092 ± 29 | (898 ± 33)[5] | 29 ± 2 | (29 ± 4)[5] |
| | | (1017 ± 78)[6] | | (50 ± 4)[7] |
| | | (1412 ± 13)[7] | | |

Thus, the present disclosure provides a method for free-breathing quantitative abdominal imaging using the MRF technique in combination with navigator echoes, which allows simultaneous and volumetric quantification of multiple tissue properties in abdomen. In the above-described, non-limiting example, only 8 partitions were acquired in approximately 8 min. However, as mentioned, the method can be accelerated by undersampling data, for example, in the partition direction. In addition, one example, the entire 16-segment acquisition for a same partition was repeated if any of the segments was not accepted. However, this can be modified to combined data acquisition of unaccepted segments from multiple partitions, which can greatly improve scan efficiency. In addition, data acquisition for MRF can also be accelerated by using simultaneous excitation of multiple slices. Furthermore, self-navigated approaches may be used to remove the deleterious effects of the navigator seen in the maps, on the left side of the subject in the example images.

Figure 28:
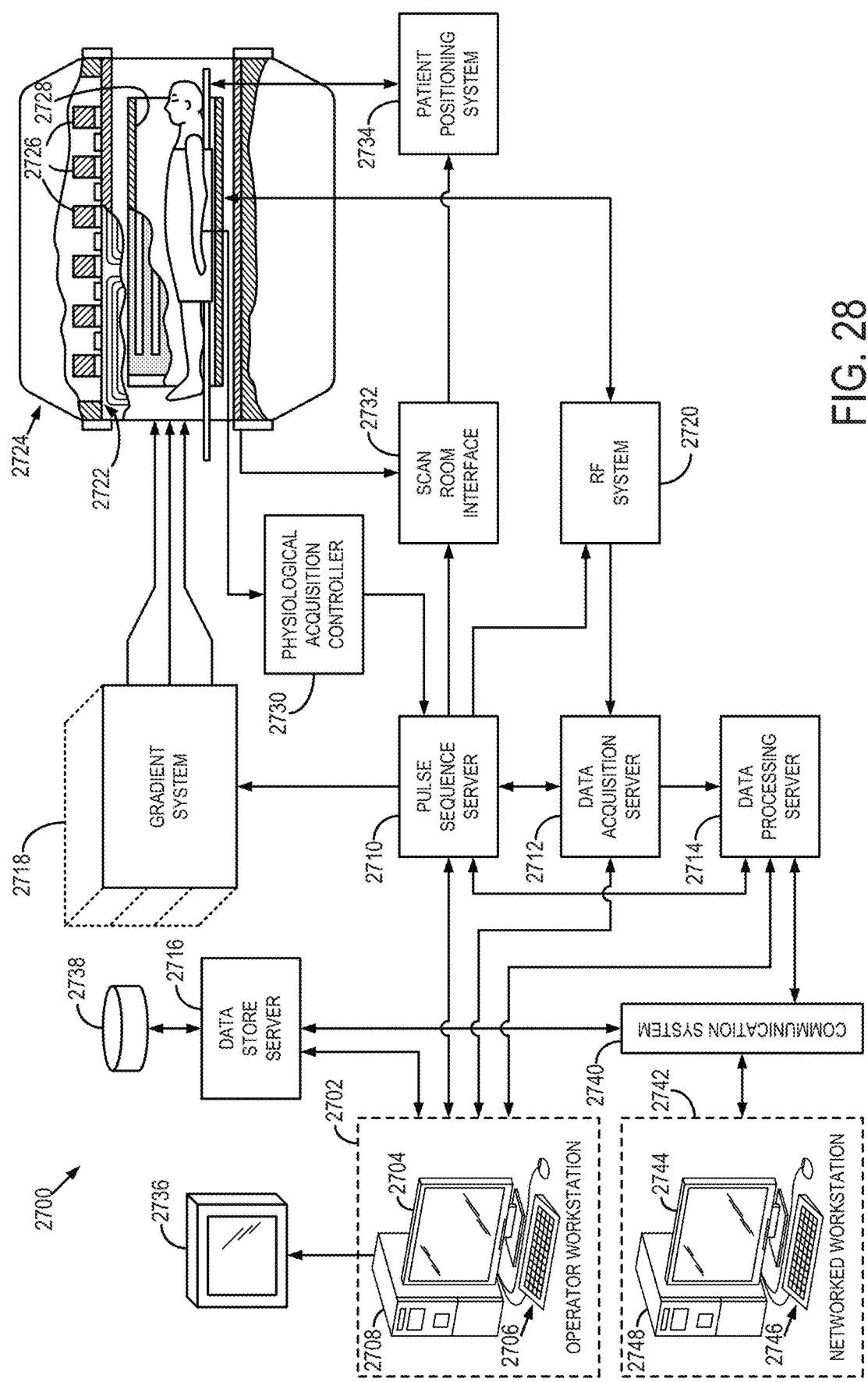
FIG. 28 is a block diagram of a NMR or MRI system that may be configured in accordance with the present disclosure.

The above-described systems and methods can be implemented on any of a variety of imaging systems. Referring to FIG. 28, an example of a system 2700 that is configured to operate to acquire nuclear magnetic resonance (NMR) data. The NMR data may include magnetic resonance imaging (MRI) data, magnetic resonance spectroscopy (MRS) data, magnetic resonance fingerprinting (MRF) data, or other data, or combinations thereof. Accordingly, as used herein, the system 2700 may be referred to as an NMR apparatus, an MRI apparatus, an MRS apparatus, and MRF apparatus, or the like without limitation to the type of data that the system can or does acquire or the configurations or variations on the general hardware and software of the system 2700. Thus, the system 2700 of FIG. 28 provides but one non-limiting example of hardware and software systems capable of performing in accordance with the present disclosure.

The system 2700 includes an operator workstation 2702, which typically includes a display 2704; one or more input devices 2706, such as a keyboard and mouse; and a processor 2708. The processor 2708 may include a commercially available programmable machine running a commercially available operating system. The operator workstation 2702 can provide the operator interface that enables scan prescriptions to be entered into the system 2700. In general, the operator workstation 2702 may be coupled to four servers: a pulse sequence server 2710; a data acquisition server 2712; a data processing server 2714; and a data store server 2716. The operator workstation 2702 and each server 2710, 2712, 2714, and 2716 are connected to communicate with each other. For example, the servers 2710, 2712, 2714, and 2716 may be connected via a communication system 2740, which may include any suitable network connection, whether wired, wireless, or a combination of both. As an example, the communication system 2740 may include both proprietary or dedicated networks, as well as open networks, such as the internet.

The pulse sequence server 2710 functions in response to instructions downloaded from the operator workstation 2702 to operate a gradient system 2718 and a radiofrequency ("RF") system 2720. Gradient waveforms necessary to perform the prescribed scan are produced and applied to the gradient system 2718, which excites gradient coils in an assembly 2722 to produce the magnetic field gradients $G_X$, $G_Y$, and $G_Z$ used for position encoding magnetic resonance signals. The gradient coil assembly 2722 forms part of a magnet assembly 2724 that includes a polarizing magnet 2726 and a whole-body RF coil 2728 and may include a local coil.

RF waveforms are applied by the RF system 2720 to the RF coil 2728, or a separate local coil (not shown in FIG. 28), in order to perform the prescribed magnetic resonance pulse sequence. Responsive magnetic resonance signals detected by the RF coil 2728, or a separate local coil (not shown in FIG. 28), are received by the RF system 2720, where they are amplified, demodulated, filtered, and digitized under direction of commands produced by the pulse sequence server 2710. The RF system 2720 includes an RF transmitter for producing a wide variety of RF pulses used in MRI pulse sequences. The RF transmitter is responsive to the scan prescription and direction from the pulse sequence server 2710 to produce RF pulses of the desired frequency, phase, and pulse amplitude waveform. The generated RF pulses may be applied to the whole-body RF coil 2728 or to one or more local coils or coil arrays.

The RF system 2720 also includes one or more RF receiver channels. Each RF receiver channel includes an RF preamplifier that amplifies the magnetic resonance signal received by the coil 2728 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \quad (11);$$

and the phase of the received magnetic resonance signal may also be determined according to the following relationship:

$$\varphi = \tan^{-1}\left(\frac{Q}{I}\right). \quad (12)$$

The pulse sequence server 2710 also optionally receives patient data from a physiological acquisition controller 2730. By way of example, the physiological acquisition controller 2730 may receive signals from a number of different sensors connected to the patient, such as electrocardiograph (ECG) signals from electrodes, or respiratory signals from a respiratory bellows or other respiratory monitoring device. Such signals are typically used by the pulse sequence server 2710 to synchronize, or "gate," the performance of the scan with the subject's heart beat or respiration.

The pulse sequence server 2710 also connects to a scan room interface circuit 2732 that receives signals from various sensors associated with the condition of the patient and the magnet system. It is also through the scan room interface circuit 2732 that a patient positioning system 2734 receives commands to move the patient to desired positions during the scan.

The digitized magnetic resonance signal samples produced by the RF system 2720 are received by the data acquisition server 2712. The data acquisition server 2712 operates in response to instructions downloaded from the operator workstation 2702 to receive the real-time magnetic resonance data and provide buffer storage, such that no data is lost by data overrun. In some scans, the data acquisition server 2712 does little more than pass the acquired magnetic resonance data to the data processor server 2714. However, in scans that require information derived from acquired magnetic resonance data to control the further performance of the scan, the data acquisition server 2712 is programmed to produce such information and convey it to the pulse sequence server 2710. For example, during prescans, magnetic resonance data is acquired and used to calibrate the pulse sequence performed by the pulse sequence server 2710. As another example, navigator signals may be acquired and used to adjust the operating parameters of the RF system 2720 or the gradient system 2718, or to control the view order in which k-space is sampled. In still another example, the data acquisition server 2712 may also be employed to process magnetic resonance signals used to detect the arrival of a contrast agent in a magnetic resonance angiography (MRA) scan. By way of example, the data acquisition server 2712 acquires magnetic resonance data and processes it in real-time to produce information that is used to control the scan.

The data processing server 2714 receives magnetic resonance data from the data acquisition server 2712 and processes it in accordance with instructions downloaded from the operator workstation 2702. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 2714 are conveyed back to the operator workstation 2702 where they are stored. Real-time images may be output to the operator display 2704 or a display 2736 that is located near the magnet assembly 2724 for use by attending physicians. Batch mode images or selected real time images are stored in a host database on disc storage 2738. When such images have been reconstructed and transferred to storage, the data processing server 2714 notifies the data store server 2716 on the operator workstation 2702. The operator workstation 2702 may be used by an operator to archive the images, produce films, or send the images via a network to other facilities.

The system 2700 may also include one or more networked workstations 2742. By way of example, a networked workstation 2742 may include a display 2744; one or more input devices 2746, such as a keyboard and mouse; and a processor 2748. The networked workstation 2742 may be located within the same facility as the operator workstation 2702, or in a different facility, such as a different healthcare institution or clinic.

The networked workstation 2742, whether within the same facility or in a different facility as the operator workstation 2702, may gain remote access to the data processing server 2714 or data store server 2716 via the communication system 2740. Accordingly, multiple networked workstations 2742 may have access to the data processing server 2714 and the data store server 2716. In this manner, magnetic resonance data, reconstructed images, or other data may exchange between the data processing server 2714 or the data store server 2716 and the networked workstations 2742, such that the data or images may be remotely processed by a networked workstation 2742. This data may be exchanged in any suitable format, such as in accordance with the transmission control protocol (TCP), the internet protocol (IP), or other known or suitable protocols.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"User", as used herein, includes but is not limited to one or more persons, software, computers or other devices, or combinations of these.

To the extent that the term "includes" or "including" is employed in the detailed description or the claims, it is inclusive in a manner similar to the term "comprising" as that term is interpreted when employed as a transitional word in a claim.

To the extent that the term "or" is employed in the detailed description or claims (e.g., A or B) it means "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one of, A, B, and C" is employed herein, (e.g., a data store configured to store one of, A, B, and C) it conveys the set of possibilities A, B, and C, (e.g., the data store may store only A, only B, or only C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it conveys the set of possibilities A, B, C, AB, AC, BC, ABC, AA . . . A, BB . . . B, CC . . . C, AA . . . ABB . . . B, AA . . . ACC . . . C, BB . . . BCC . . . C, or AA . . . ABB . . . BCC . . . C (e.g., the data store may store only A, only B, only C, A&B, A&C, B&C, A&B&C, or other combinations thereof including multiple instances of A, B, or C). It is not intended to require one of A, one of B, and one of C. When the applicants intend to indicate "at least one of A, at least one of B, and at least one of C", then the phrasing "at least one of A, at least one of B, and at least one of C" will be employed.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for generating quantitative images of a subject, the method comprising:
   performing a pulse sequence, using a nuclear magnetic resonance (NMR) system, that includes steps of:
   (i) performing a navigator module to acquire navigator data during free breathing of the subject;
   (ii) performing an acquisition module during the free breathing of the subject to acquire NMR data from a volume in the subject that contains one or more resonant species that simultaneously produce individual NMR signals in response to the acquisition module;

(iii) repeating steps (i) and (ii) to acquire data from a plurality of partitions across the volume;

(iv) analyzing the navigator data to determine that the NMR data meets a predetermined condition and repeating steps (i) and (ii) for at least an affected partition corresponding to NMR data that did not meet the predetermined condition;

comparing the NMR data to a dictionary of signal evolutions to determine quantitative values for two or more parameters of the resonant species in the volume based, at least in part, on matching the acquired NMR data to a set of known MRF signal evolutions stored in the dictionary, wherein the two or more parameters include T1, T2, and proton density, T1 being spin-lattice relaxation, T2 being spin-spin relaxation; and producing an image of at least the volume of the subject based, at least in part, on the quantitative values.

2. The method of claim 1 wherein the volume of interest is in motion during the free breathing of the subject and wherein the predetermined condition is a motion artifact condition.

3. The method of claim 1 wherein the acquisition module includes a fast imaging with steady-state free precession (FISP) MRF pulse sequence applied to the volume by an NMR apparatus.

4. The method of claim 3 wherein the acquisition modules further include a magnetization preparation module and a fat suppression module.

5. The method of claim 4 wherein the magnetization preparation module further includes an inversion recovery module or a T2-preparation module.

6. The method of claim 1 wherein the volume is located in an abdomen of the subject.

7. The method of claim 1 wherein the set of known MRF signal evolutions includes signal evolutions based on combinations of T1, T2, and proton density, where T1 varies in a range of 10-3000 ms, T2 varies in a range of 5-500 ms, and B1 varies in a range of 10% to 200% of the B1 field intended to be produced by the NMR apparatus.

8. The method of claim 1 wherein the pulse sequence includes controlling the NMR apparatus to perform the acquisition module using a FISP-MRF pulse sequence with varied repetition times between repetitions of step (ii).

9. The method of claim 1 wherein the pulse sequence includes controlling the NMR apparatus to perform the acquisition module using a FISP-MRF pulse sequence with a constant repetition time between repetitions of step (ii).

10. The method of claim 1 wherein the pulse sequence includes controlling the NMR apparatus to perform the acquisition module using a FISP-MRF pulse sequence with varied flip angles between repetitions of step (ii).

11. The method of claim 8 wherein the flip angles are one of random, pseudo-random, or otherwise varied within a range of 4 to 15 degrees.

12. The method of claim 1 wherein the acquisition module includes a spiral readout.

13. The method of claim 1 wherein the pulse sequence includes a plurality of sequence blocks, each with imaging parameters that are varied with respect to at least one other member in the plurality of sequence blocks by at least one echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, a number of gradients applied during a readout portion of a sequence block, an amount of RF spoiling, or an amount of gradient spoiling.

14. The method of claim 1 wherein the set of known MRF signal evolutions includes signal evolutions outside the set of signal evolutions characterized by:

$$SE = A - Be^{-t/C}$$

where:
SE is a signal evolution,
A is a constant,
B is a constant,
t is time, and
C is a single relaxation parameter.

15. A method for generating three-dimensional imaging data from an abdomen of a subject, the method comprising:

acquiring, using a nuclear magnetic resonance (NMR) system, NMR data from a volume in an abdomen of a subject using a series of partitions, where each partition includes one or more segments, where each segment comprises:

(i) a navigator module configured to acquire navigator data during a free breathing period of the subject;

(ii) an acquisition module configured to acquire NMR data from the abdomen during the free breathing period, where the acquisition module is configured to elicit one or more resonant species within the abdomen to simultaneously produce a signal evolution;

(iii) repeating steps (i) and (ii) to acquire data from a plurality of partitions across the volume in the abdomen of the subject;

(iv) analyzing the navigator data to determine that the NMR data meets a predetermined condition and repeating steps (i) and (ii) for at least an affected partition corresponding to NMR data that did not meet the predetermined condition;

comparing the NMR data to a dictionary of signal evolutions to determine quantitative values for two or more parameters of the resonant species in the volume based, at least in part, on matching the acquired NMR data to a set of known MRF signal evolutions stored in the dictionary; and producing a three-dimensional image of the volume in the abdomen based, at least in part, on the quantitative values.

16. The method of claim 15 wherein the volume is in motion during the free breathing of the subject and wherein the predetermined condition is a motion respiratory artifact.

17. The method of claim 15 wherein the acquisition module includes at least one magnetization preparation module configured before the acquisition module, and wherein the acquisition module comprises a fast imaging with steady-state free precession (FISP) MRF pulse sequence applied to the volume by an NMR apparatus.

18. A magnetic resonance imaging (MRI) system comprising:

a magnet system configured to generate a polarizing magnetic field about at least a portion of a subject arranged in the MRI system;

a plurality of gradient coils configured to apply a gradient field to the polarizing magnetic field;

a radio frequency (RF) system configured to apply an excitation field to the subject and acquire MR image data from a ROI;

a computer system programmed to:

control the plurality of gradient coils and the RF system to perform a pulse sequence by:
  (i) performing a navigator module to acquire navigator data during free breathing of the subject;
  (ii) performing an acquisition module during the free breathing of the subject to acquire NMR data from a volume in the subject that contains one or more resonant species that simultaneously produced individual NMR signals in response to the acquisition module;
  (iii) repeating steps (i) and (ii) to acquire data from a plurality of partitions across the volume;
  (iv) analyzing the navigator data to determine that the NMR data meets a predetermined condition and repeating steps (i) and (ii) for at least an affected partition corresponding to NMR data that did not meet the predetermined condition;

compare the NMR data to a dictionary of signal evolutions to determine quantitative values for two or more parameters of the resonant species in the volume based, at least in part, on matching the acquired NMR data to a set of known MRF signal evolutions stored in the dictionary, wherein the two or more parameters include T1, T2, and proton density, T1 being spin-lattice relaxation, T2 being spin-spin relaxation;

produce an image of at least the volume of the subject based, at least in part, on the quantitative values; and a display to display the image of at least the volume of the subject based, at least in part, on the quantitative values.

19. The MRI system of claim 18 wherein the volume is located in an abdomen of the subject.

20. The MRI system of claim 18 wherein the pulse sequence includes controlling the RF system to perform the acquisition module using a FISP-MRF pulse sequence with varied flip angles between repetitions of step (ii).

* * * * *